(12) United States Patent
Sim et al.

(10) Patent No.: US 11,178,779 B2
(45) Date of Patent: Nov. 16, 2021

(54) DISPLAY DEVICE

(71) Applicant: Samsung Display Co., Ltd., Yongin-si (KR)

(72) Inventors: Jin Yong Sim, Seongnam-si (KR); In Soo Park, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/930,293

(22) Filed: May 12, 2020

(65) Prior Publication Data

US 2021/0127506 A1    Apr. 29, 2021

(30) Foreign Application Priority Data

Oct. 25, 2019    (KR) ........................ 10-2019-0133868

(51) Int. Cl.

| H05K 5/00 | (2006.01) |
|---|---|
| H01L 51/52 | (2006.01) |
| H05K 5/03 | (2006.01) |
| H05K 1/18 | (2006.01) |
| H05K 1/14 | (2006.01) |
| H05K 5/02 | (2006.01) |

(52) U.S. Cl.
CPC ....... *H05K 5/0017* (2013.01); *H01L 51/5237* (2013.01); *H05K 1/147* (2013.01); *H05K 1/189* (2013.01); *H05K 5/0226* (2013.01); *H05K 5/03* (2013.01); *H05K 2201/10128* (2013.01)

(58) Field of Classification Search
CPC .................................... H05L 5/0017

USPC ......................................................... 361/749
See application file for complete search history.

(56) References Cited

U.S. PATENT DOCUMENTS

| 7,381,901 | B2 | 6/2008 | Tanaka et al. |
| 7,660,126 | B2 | 2/2010 | Cho et al. |
| 10,469,635 | B1* | 11/2019 | Carlson ................ G06F 1/1616 |
| 2010/0147581 | A1* | 6/2010 | Mitomi ............... H04M 1/0274 |
| | | | 174/520 |
| 2012/0224814 | A1* | 9/2012 | Hirano ..................... H04N 7/22 |
| | | | 385/49 |
| 2016/0007441 | A1* | 1/2016 | Matsueda ........... H01L 51/0097 |
| | | | 361/749 |
| 2018/0102496 | A1* | 4/2018 | Kim ...................... H01L 23/552 |
| 2018/0196300 | A1* | 7/2018 | Jung .................... H05K 1/0277 |

(Continued)

FOREIGN PATENT DOCUMENTS

| JP | 2007-268324 | 10/2007 |
| KR | 10-0541958 | 1/2006 |

(Continued)

*Primary Examiner* — Stanley Tso
(74) *Attorney, Agent, or Firm* — H.C. Park & Associates, PLC

(57) ABSTRACT

A display device including a display module having defined thereon a folding region, a first non-folding region disposed on one side of the folding region, and a second non-folding region disposed on an opposite side of the folding region; a fixing member disposed under the folding region of the display module; and a first flexible printed circuit board disposed between the folding region of the display module and the fixing member. The first flexible printed circuit board includes a (1-1) portion overlapping with the fixing member, and the (1-1) portion of the first flexible printed circuit board is attached to the fixing member.

19 Claims, 17 Drawing Sheets

(56) References Cited

U.S. PATENT DOCUMENTS

| | | | | |
|---|---|---|---|---|
| 2018/0324964 A1* | 11/2018 | Yoo | ............... | G06F 1/1681 |
| 2019/0081380 A1* | 3/2019 | Bates | ............ | H01L 25/0655 |
| 2019/0200466 A1* | 6/2019 | Kim | ............... | G06F 1/1652 |
| 2021/0037646 A1* | 2/2021 | Xiao | ............... | G02F 1/13452 |
| 2021/0055763 A1 | 2/2021 | Park | | |

FOREIGN PATENT DOCUMENTS

| | | |
|---|---|---|
| KR | 10-0863091 | 10/2008 |
| KR | 10-2018-0122210 | 11/2018 |
| KR | 20210022189 | 3/2021 |

* cited by examiner

DISPLAY DEVICE

CROSS REFERENCE TO RELATED APPLICATION

This application claims priority from and the benefit of Korean Patent Application No. 10-2019-0133868 filed on Oct. 25, 2019, which is hereby incorporated by reference for all purposes as if fully set forth herein.

BACKGROUND

Field

Exemplary embodiments of the invention relate generally to a display device, and more specifically, to a display device that can switch between a folded state and an unfolded state.

Discussion of the Background

Display devices are for displaying images and include a display panel, such as an organic light-emitting display panel or a liquid-crystal display panel.

A mobile electronic device includes a display device for providing an image to a user. More and more mobile electronic devices have larger display screens even with the same or smaller volume or thickness compared to existing display devices. Also, a foldable display device or a bendable display device having a structure that can be folded and unfolded to provide a large screen only when it is used is being developed.

The above information disclosed in this Background section is only for understanding of the background of the inventive concepts, and, therefore, it may contain information that does not constitute prior art.

SUMMARY

Exemplary embodiments of the present invention provide a display device that can reduce the possibility that a flexible printed circuit board may be damaged or interfere with nearby elements in a folding region.

Additional features of the inventive concepts will be set forth in the description which follows, and in part will be apparent from the description, or may be learned by practice of the inventive concepts.

An exemplary embodiment of the present invention provides a display device including a display module having defined thereon a folding region, a first non-folding region disposed on one side of the folding region, and a second non-folding region disposed on an opposite side of the folding region; a fixing member disposed under the folding region of the display module; and a first flexible printed circuit board disposed between the folding region of the display module and the fixing member. The first flexible printed circuit board includes a (1-1) portion overlapping with the fixing member, and the (1-1) portion of the first flexible printed circuit board is attached to the fixing member.

The display module may include a first surface facing a display side and a second surface opposite to the first surface, and the folding region may be bent when the display device folded so that a surface of the first non-folding region faces a surface of the second non-folding region.

The fixing member may have a convex cross-sectional shape facing away from the display side.

The (1-1) portion of the first flexible printed circuit board may have a convex cross-sectional shape facing away from the display side.

The display device may further include a first coupling member disposed between the (1-1) portion and the fixing member, in which the (1-1) portion may be coupled with the fixing member by the first coupling member.

The display device may further include a hinge assembly disposed between the (1-1) portion and the folding region of the display module. The folding region of the display module may be bent over the hinge assembly, and the fixing member may cover the hinge assembly.

The display device may further include a battery overlapping the first non-folding region. The first flexible printed circuit board may further include a (1-2) portion that is connected to the (1-1) portion and overlaps the first non-folding region, and the (1-2) portion may be electrically connected to the battery.

The (1-2) portion may further include a first connector, and the first connector may be physically connected to the battery.

The display device may further include a main circuit board overlapping the second non-folding region, in which the first flexible printed circuit board may further include a (1-3) portion that is connected to the (1-1) portion and overlaps the second non-folding region. The (1-3) portion may be electrically connected to the main circuit board.

The (1-3) portion may further include a second connector, and the second connector may be physically connected to the main circuit board.

The battery and the main circuit board may be electrically connected to each other through the first flexible printed circuit board.

The display device may further include a second coupling member disposed between the (1-2) portion and the display module. The (1-2) portion may include a (1-2-1) portion attached to the display module by the second coupling member, and a (1-2-2) portion spaced apart from the (1-1) portion with the (1-2-1) portion therebetween.

The (1-2-2) portion may have a first thickness and include at least one curved shape when that display device is unfolded. A curvature of the curved shape may be 5 to 30 times the first thickness, and the at least one curved shape of the (1-2-1) portion may be unrolled when the display device is folded.

A width of the (1-2-2) portion may be less than a width of the (1-2-1) portion and a width of the (1-1) portion.

The (1-2-2) portion may include at least one hole penetrating through the (1-2-2) portion from a surface thereof, and the hole may be extended from the first non-folding region toward the folding region when viewed from top.

The display device may further include a third coupling member disposed between the (1-3) portion and the display module. The (1-3) portion may include a (1-3-1) portion attached to the display module by the third coupling member, and a (1-3-2) portion may be spaced apart from the (1-1) portion with the (1-3-1) portion therebetween.

The display device may further include a second flexible printed circuit board disposed between the folding region of the display module and the fixing member. The second flexible printed circuit board may be attached to the fixing member.

The display device may further include an external terminal for receiving an external signal. One side of the second flexible printed circuit board may overlap the battery and be electrically connected to the external terminal, another side of the second flexible printed circuit board may be electrically connected to the main circuit board, and the external terminal and the main circuit board may be electrically connected to each other through the second flexible printed circuit board.

Another exemplary embodiment of the present invention provides a display device including a display module having defined thereon a folding region, a first non-folding region disposed on one side of the folding region, and a second non-folding region disposed on an opposite side of the folding region; a fixing member disposed under the folding region of the display module; and a first flexible printed circuit board disposed between the folding region of the display module and the fixing member. The first flexible printed circuit board includes a (1-1) portion overlapping with the fixing member, a (1-2) portion connected to the (1-1) portion and overlapping with the first non-folding region, and a (1-3) portion overlapping with the second non-folding region. The (1-1) portion of the first flexible printed circuit board is attached to the fixing member. The display module includes a first surface facing a display side and a second surface opposite to the first surface. The folding region is bent when the display device is folded so that a surface of the first non-folding region and a surface of the second non-folding region face each other. Each of the (1-2) portion and the (1-3) portion includes at least one curved shape when the display device is unfolded, and the curved shape of each of the (1-2) portion and the (1-3) portion is unrolled when the display device is folded.

The (1-2) portion may include a (1-2-1) portion attached to the display module, and a (1-2-2) portion spaced apart from the (1-1) portion with the (1-2-1) portion therebetween. The (1-3) portion may include a (1-3-1) portion attached to the display module and a (1-3-2) portion spaced apart from the (1-1) portion with the (1-3-1) portion therebetween. Each of the (1-2-2) portion and the (1-3-2) portion may include at least one curved shape when the display device is unfolded, and the curved shape of the (1-2-2) portion and the curved shape of the (1-3-2) portion may be unrolled when the display device is folded.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIG. 10 is a view showing yet another exemplary embodiment of that shown in

FIG. 5.

FIG. 12 is a view showing yet another exemplary embodiment of that shown in

FIG. 5.

FIG. 14 is a view showing yet another exemplary embodiment of that shown in

FIG. 5.

FIG. 15 is a view showing yet another exemplary embodiment of that shown in

FIG. 5.

DETAILED DESCRIPTION OF THE EMBODIMENTS

Figure 1:
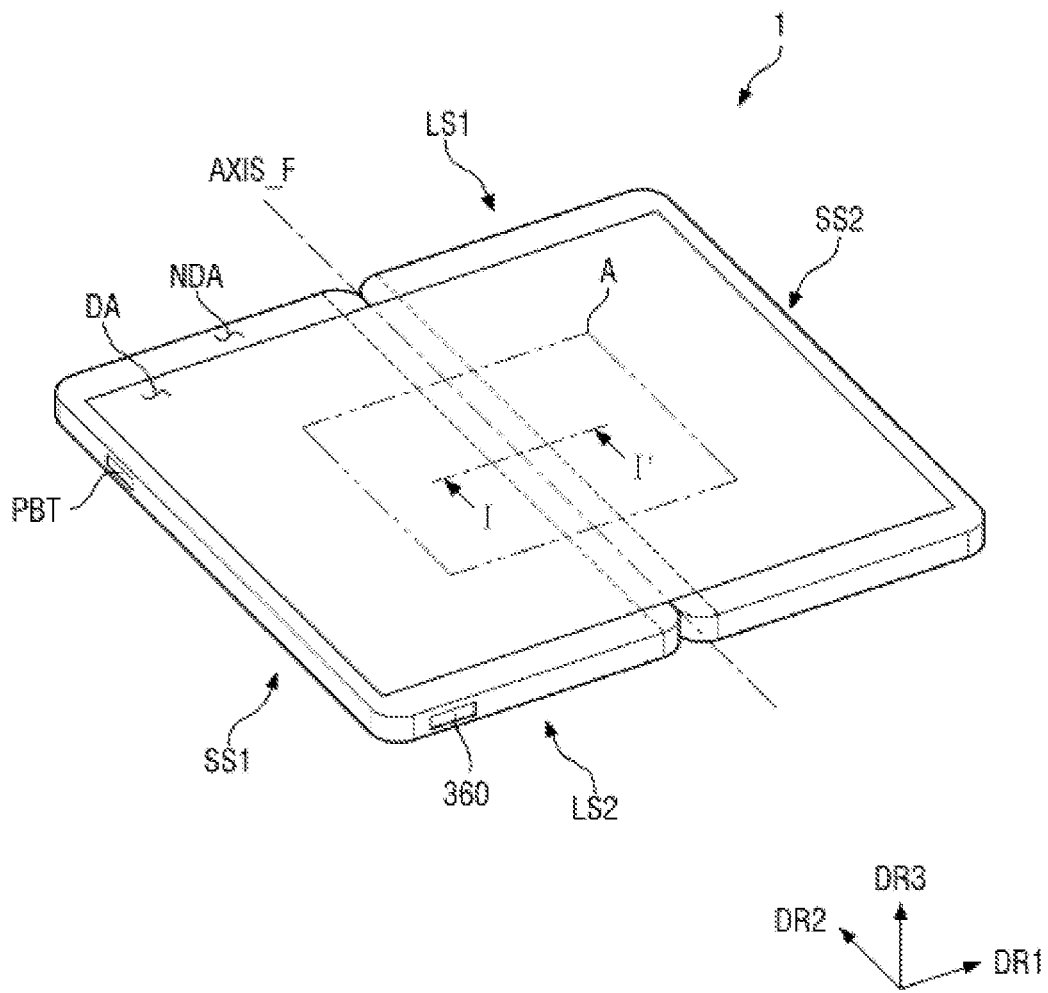
FIG. 1 is a perspective view of a display device according to an exemplary embodiment of the present invention.

In the following description, for the purposes of explanation, numerous specific details are set forth in order to provide a thorough understanding of various exemplary embodiments of the invention. As used herein "embodiments" are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, exemplary embodiments of the present invention will be described with reference to the attached drawings.

FIG. 1 is a perspective view of a display device according to an exemplary embodiment of the present invention.

Referring to FIG. 1, a display device 1 may be a foldable display device. As used herein, the term foldable may refer to a flexible state, and specifically, may encompass bendable, rollable, etc. Further, the term foldable should be interpreted as encompassing partially foldable, fully foldable, in-foldable, and out-foldable.

The display device 1 may include a folding axis AXIS_F extended in the vertical direction of the display device when viewed from the top. The display device 1 may be folded along the folding axis AXIS_F.

The display device 1 may have a substantially rectangular shape when viewed from the top. The display device 1 may be either a rectangle having sharp corners or a rectangle having rounded corners when viewed from the top. The display device may include four edges LS1, LS2, SS1, and SS2. The display device may include longer-side edges LS1 and LS2 and shorter-side edges SS1 and SS2. For example, the longer-side edges LS1 and LS2 may be extended in the first direction DR1, while the shorter-side edges SS1 and SS2 may be extended in the second direction DR2.

As shown in FIG. 1, the folding axis AXIS_F may be extended in the direction traversing the longer sides LS1 and LS2, e.g., the second direction DR2. In such case, the longer-side edges LS1 and LS2 of the display device 1 may be folded. Unlike what is shown in the drawings, the folding axis AXIS_F may be extended in the direction traversing the shorter sides SS1 and SS2, in which case the shorter-side edges SS1 and SS2 of the display device 1 may be folded. In the following description, the folding axis AXIS_F is extended in the direction traversing the longer-side edges LS1 and LS2 for convenience of illustration. The folding axis AXIS_F may cross the central portion of each of the longer-side edges LS1 and LS2, but the present disclosure is not limited thereto.

As used herein, "above" and "upper surface" in the thickness direction refer to the display side, whereas "below" and "lower surface" refer to the opposite side, unless specifically stated otherwise. In addition, "upper side," "lower side," "left side," and "right side" in the plane are defined when the display surface is viewed from the top.

The display device 1 may include a display area DA and a non-display area NDA surrounding the display area DA. In the display area DA, images are displayed. In the non-display area NDA, images are not displayed. The display area DA may be located in the center portion of display device 1. When the display device 1 is folded, subsidiary areas of the display area DA that are separated by the folding axis AXIS_F may overlap each other. When the display device 1 is unfolded, the subsidiary areas of the display area DA may be unfolded such that images may be displayed. Although not shown in the drawings, the non-display area NDA may further include a pad area connected to a printed circuit board. A plurality of pads may be disposed in the pad area to be electrically connected to lead lines of the printed circuit board.

Grooves (e.g., notches) recessed toward the upper side and the lower side when viewed from the top may be formed at the intersections of the folding axis AXIS_F and the first longer side LS1 and the second longer side LS2 of the display device 1, respectively. A hinge assembly for switching between the states may be coupled at each of the grooves, for example.

Figure 3:
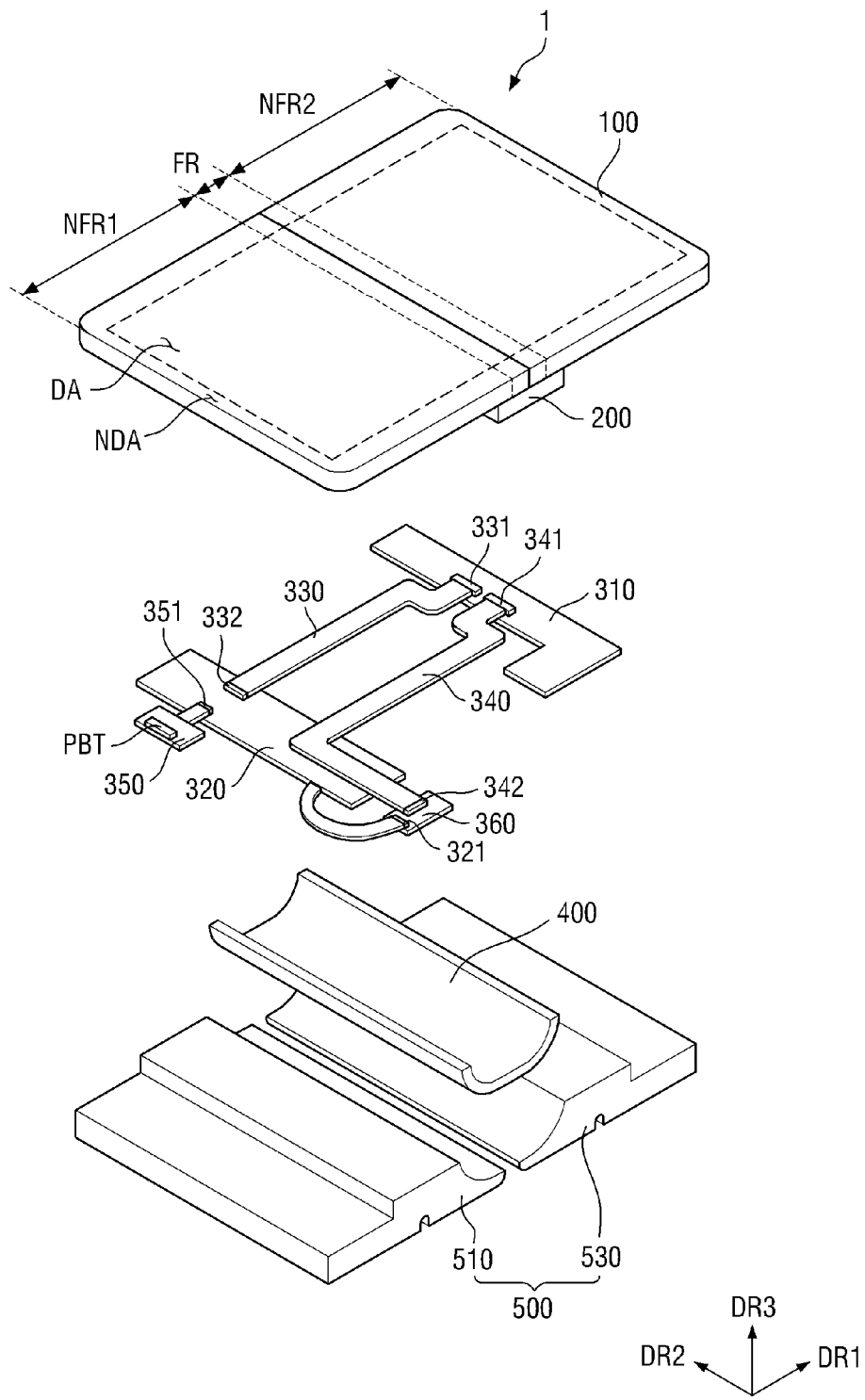
FIG. 3 is an exploded, perspective view of a display device according to an exemplary embodiment of the present invention.

The display device 1 may include a display module 100 (see FIG. 3). As will be described below with reference to FIG. 3, a folding region FR and non-folding regions NFR1 and NFR2 may be defined on the display module 100 with respect to the folding axis AXIS_F (see FIG. 3).

Specifically, the display module 100 may include the folding region FR located at the center portion and including the folding axis AXIS_F, and the non-folding regions NFR1 and NFR2 spaced apart from each other with the folding region FR therebetween. The first non-folding region NFR1 may be located on one side of the folding region FR in the first direction DR1, while the second non-folding region NFR2 may be located on the other side of the folding region FR in the first direction DR1.

The folding region FR may be the portion of the display module 100 that is folded or bent with a predetermined curvature in a folding direction when the display device 1 is folded. The non-folding regions NFR1 and NFR2 may be the portions that are not folded when the display device 1 is folded, unlike the folding region FR. The non-folding regions NFR1 and NFR2 may be located on the same flat plane, but the inventive concepts are not limited thereto. The non-folding regions NFR1 and NFR2 may be bent partially.

A power button PBT may be further disposed on the side surface adjacent to one of the shorter-side edges SS1 and SS2 of the display device 1. An external terminal 360 may be further disposed on side surface adjacent to one of the longer-side edges LS1 and LS2 of the display device 1. Although the power button PBT is disposed on the side surface adjacent to the first shorter-side edge SS1, and the external terminal 360 is disposed on the side surface adjacent to the second longer-side edge LS2 in the example shown in FIG. 1, their locations may be modified. The power button PBT may be electrically connected to a battery of the display device 1, and the battery may be electrically connected to a main circuit board. Specifically, when a physical on/off signal or a touch-type on/off signal is input to the power button PBT, the on/off signal is applied to the battery. Then, the on/off signal is applied to the main circuit board, to allow the main circuit board to control the on/off of the battery according to the on/off signal applied to the power button PBT. In addition, the external terminal 360 may be electrically connected to the main circuit board so that a data signal applied through the external terminal 360 may be provided to the main circuit board. Unfortunately, the main circuit board, the battery and the external terminal connected to the main circuit board have certain sizes, and thus, it is not easy to dispose them in a dense area. Accordingly, the main circuit board may be disposed in one of the non-folding regions NFR1 and NFR2, and the battery and the external terminal may be disposed in the other one. In addition, flexible printed circuit boards for electrically connecting them may be further disposed in the folding region FR. Even though the flexible printed circuit boards are made of a flexible material, they may be broken or may interfere with nearby elements after the folding operation and the unfolding operation are repeated numerous times.

Hereinafter, operations of the display device 1 according to an exemplary embodiment of the present invention will be described.

Figure 2:
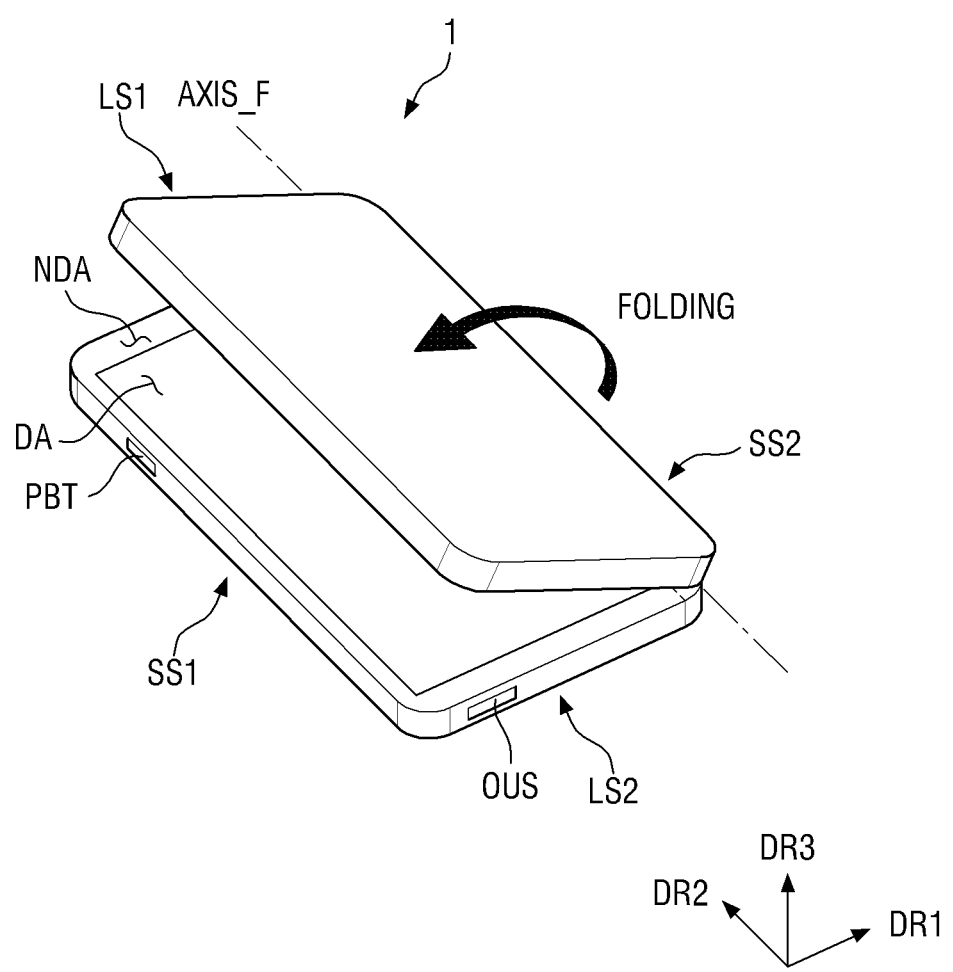
FIG. 2 is a perspective view of the display device according to an exemplary embodiment of the present invention when it is folded.

FIG. 2 is a perspective view of the display device according to an exemplary embodiment of the present invention when it is folded.

Referring to FIG. 2, when an external force is applied from the right side along the folding direction (the upper direction or the third direction DR3 of FIG. 2), the display device 1 is folded, such that the folding region FR of the display module 100 is bent or folded while the second non-folding region NFR2 of the display module 100 may be moved or rotated along the folding direction to overlap the first non-folding region NFR1 or face it. Specifically, the display module 100 includes a first surface and a second surface opposite to the first surface. When the display device 1 according to the exemplary embodiment of the present invention is a top-emission display device, the first surface of the display module 100 may be the display surface of the display device 1 while the second surface may be the opposite surface to the display surface.

When the display device 1 is folded, the folding region FR of the display module 100 may be bent such that the first surfaces of the non-folding regions NFR1 and NFR2 of the display module 100 face each other.

In other words, in the example shown in FIG. 2, the display device 1 according to the exemplary embodiment of the present invention is an in-folding display device, i.e., the display surfaces of the flat portions of the display module 100 face each other while the opposite surfaces face opposite sides when the display device 1 is folded.

In some exemplary embodiments, the display device 1 may be an out-folding display device. In the following description, an in-folding display device is employed as the display device 1.

Figure 4:
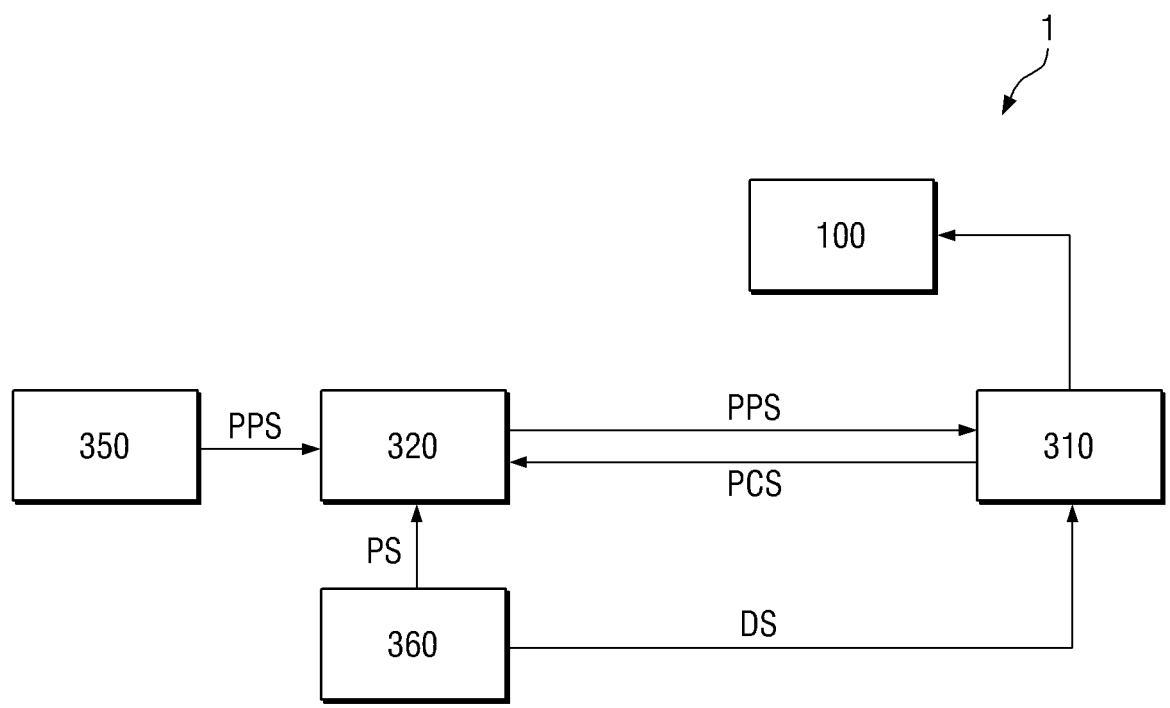
FIG. 4 is a block diagram showing a connective relationship between the display module, the main circuit board, the battery and the external terminal according to an exemplary embodiment of the present invention.

FIG. 3 is an exploded, perspective view of a display device according to an exemplary embodiment of the present invention. FIG. 4 is a block diagram showing a connective relationship between the display module, the main circuit board, the battery and the external terminal according to an exemplary embodiment of the present invention.

Referring to FIGS. 3 and 4, the display device 1 according to the exemplary embodiment of the present invention may include the display module 100; a hinge assembly 200 disposed under the display module 100; a main circuit board 310 disposed under the hinge assembly 200; a battery 320;

a subsidiary circuit board 350 on which a power button PBT is disposed; a first flexible printed circuit board 330; a second flexible printed circuit board 340; an external terminal 360; a fixing member 400 disposed under the main circuit board 310, the battery 320, the subsidiary circuit board 350 on which the power button PBT is disposed, the first flexible printed circuit board 330, the second flexible printed circuit board 340 and the external terminal 360; and set covers 500: 510 and 530 disposed under the fixing member 400.

The display module 100 may include a display panel 110 (see FIG. 6) for displaying an image by an input data signal, and support members 161 and 163 and metal plates 171 and 173 disposed under the display panel 110.

An organic light-emitting display panel, a liquid-crystal display panel, a plasma display panel, an electrophoretic display panel, an electrowetting display panel, a quantum-dot emission display panel, a micro LED display panel, a nano LED display panel, etc. may be employed as the display panel 110. In the illustrated exemplary embodiment, an organic light-emitting display panel is employed as the display panel 110.

The display panel 110 may include a flexible substrate including a flexible polymer material, such as polyimide (PI). Accordingly, the display panel 110 may be curved, bent, folded, or rolled. The display panel 110 may have a shape substantially similar to that of the display device 1 when viewed from the top.

The display panel 100 will be described in more detail later.

The hinge assembly 200 may be disposed under the display module 100. The hinge assembly 200 may generally overlap with the folding region FR and may extend to a part of the adjacent non-folding regions NFR1 and NFR2. The hinge assembly 200 may serve to switch between the states of the display device 1. The hinge assembly 200 will be described in detail later.

The main circuit board 310 may overlap with the second non-folding region NFR2. As mentioned earlier, it is difficult to dispose the main circuit board 310, the battery 320 and the external terminal 360 in a narrow area, and thus, they may be disposed in different areas. They do not include a flexible material and, accordingly, are relatively hard. Therefore, they cannot be disposed in the folding region FR that is bent. According to the exemplary embodiment shown in FIG. 3, the main circuit board 310 may be disposed on the second non-folding region NFR2, and the battery 320 and the external terminal 360 may be disposed on the first non-folding region NFR1. It is, however, to be understood that the inventive concepts are not limited thereto. Their positions may be reversed. In the following description, the main circuit board 310 is disposed on the second non-folding region NFR2 while the battery 320 and the external terminal 360 are disposed on the first non-folding region NFR1. The main circuit board 310 may be electrically connected to the display panel 110 of the display module 100 to provide the display panel 110 with signals for driving pixels, such as a data voltage signal, a scan signal, a supply voltage, etc.

The first flexible printed circuit board 330 may be disposed between the battery 320 and the main circuit board 310. The first flexible printed circuit board 330 may be electrically connected to the battery 320 through a connector 332 included in the first flexible printed circuit board 330. The connector 332 may be physically connected to the battery 320. The first flexible printed circuit board 330 may be electrically connected to the main circuit board 310 through a connector 331 included in the first flexible printed circuit board 331. The connector 331 may be physically connected to the main circuit board 310.

The subsidiary circuit board 350 may be further disposed on one side of the battery 320. The power button PBT may be disposed on the subsidiary circuit board 350. The subsidiary circuit board 350 and the battery 320 may be electrically connected with each other through a connector 351 included in the subsidiary circuit board 350. The connector 351 may be physically connected to the battery 320. Since the power button PBT disposed on the subsidiary circuit board 350 is electrically connected to the subsidiary circuit board 350, the power button PBT may be electrically connected to the battery 320.

When a physical on/off signal or a touch-type on/off signal is input to the power button PBT, the on/off signal PPS may be applied to the battery 320. Then, the on/off signal PPS may be applied to the main circuit board 310, to allow the main circuit board 310 to control the on/off of the battery 320 according to the on/off signal input to the power button PBT (with the on/off control signal PCS).

The external terminal 360 may be electrically connected to the battery 320 through a connector 321 included in the battery 320. The connector 321 may be physically connected to the external terminal 360. Accordingly, when an external device for charging is connected to the external terminal 360, a charging signal or a charging voltage signal PS applied from the external device may be applied to the battery 320 so that the battery 320 can be charged.

In addition, the external terminal 360 may serve to transfer a data signal DS to the main circuit board 310. Specifically, the second flexible printed circuit board 340 may be further disposed between the battery 320 and the main circuit board 310. The second flexible printed circuit board 340 may be electrically connected to the external terminal 360 through a connector 342 included in the second flexible printed circuit board 340. The connector 342 may be physically connected to the external terminal 360. The second flexible printed circuit board 340 may be electrically connected to the main circuit board 310 through a connector 341 included in the second flexible printed circuit board 340. The connector 341 may be physically connected to the main circuit board 310. That is to say, when an external device for transmitting data that provides a data signal DS to the display device 1 is connected to the external terminal 360, the data signal DS applied to the external terminal 360 may be supplied to the main circuit board 310 through the a second flexible printed circuit 340.

The first flexible printed circuit board 330 may be spaced apart from the second flexible printed circuit board 340 in the second direction DR2. The first flexible printed circuit board 330 may be located closer to the upper longer side of the display device 1 than is the second flexible printed circuit board 340. In other words, the second flexible printed circuit board 340 may be located closer to the lower longer side of the display device 1 than is the first flexible printed circuit board 330. This arrangement allows the second flexible printed circuit board 340 to be easily connected to the external terminal 360 without interfering with the first flexible circuit board 330 in the exemplary embodiment where the external terminal 360 is disposed closer to the second longer-side edge LS2 on the lower side of the display device 1.

The flexible printed circuit boards 330 and 340 may overlap with the folding region FR. Further, the flexible printed circuit boards 330 and 340 may overlap with a part of the adjacent non-folding regions NFR1 and NFR2 for connecting to the main circuit board 310, the battery 320, or the external terminal 360 described above.

The first flexible printed circuit board 330 may have a line shape extended generally along the first direction DR1. The second flexible printed circuit board 340 may have a first line shape portion that is extended generally in the first direction DR1 from a first portion overlapping the battery 320 to the portion connected to the main circuit board 310, and a second line shape portion that is extended from the first line shape portion (the first portion) in the second direction DR2. The connector 341 may be disposed at the end of the first line shape portion to be connected to the main circuit board 310, and the connector 342 may be disposed at the end of the second line shape portion to be connected to the external terminal 360.

The fixing member 400 may be disposed under the battery 320, the main circuit board 310, and the flexible printed circuit boards 330 and 340. The fixing member 400 may be a hinge cover member that covers the hinge assembly 200. The fixing member 400 may overlap the folding region FR to cover the hinge assembly 200. According to the exemplary embodiment, the fixing member 400 is attached to the flexible printed circuit boards 330 and 340 and coupled with the flexible printed circuit boards 330 and 340 overlapping the folding region FR that is bent. Accordingly, it is possible to prevent breakage of the flexible printed circuit boards 330 and 340 and/or interference with nearby elements (e.g., the hinge assembly 200) as the display device 1 is folded and unfolded repeatedly. The flexible printed circuit boards 330 and 340 may be coupled with the fixing member 400 by a first coupling member to be described later. The portions of the flexible printed circuit boards 330 and 340 coupled with the fixing member 400 remains coupled with the fixing member 400 even though the display device 1 is folded and unfolded repeatedly, and thus, there is almost no change in length. Accordingly, it is possible to prevent interference between nearby elements. Furthermore, the first coupling member attached directly to the flexible printed circuit boards 330 and 340 can buffer or reduce the bending stress applied to the flexible printed circuit boards 330 and 340 as the display device is folded and unfolded repeatedly. In addition, as described above, because the portions of the flexible printed circuit boards 330 and 340 coupled with the fixing member 400 are coupled with the fixing member 400, there is no change in the length even though the display device is folded and unfolded repeatedly, so that it is possible to avoid breakage of the flexible printed circuit boards 330 and 340.

The fixing member 400 may have a curved cross-sectional shape to cover the hinge assembly 200. The curved shape may be convex toward the second surface of the display module 100. The portions of the flexible printed circuit boards 330 and 340 attached to the fixing member 400 having the curved cross-sectional shape may have a curved shape that is convex toward the second surface conforming to the cross-sectional shape of the fixing member 400.

The set covers 500: 510 and 530 may be disposed under the fixing member 400. The first set cover 510 may be disposed on the first non-folding region NFR1, and the second set cover 530 may be disposed on the second non-folding region NFR2. The set covers 510 and 530 may be disposed under the above-described elements to protect them. When the display device is unfolded, the lower surfaces of the first set cover 510 and the second set cover 530 may be positioned on substantially the same plane. When the display device is folded, however, the lower surfaces may be moved to face in different directions. The first set cover 510 and the second set cover 530 may be spaced apart from each other with the folding region FR or a part of the folding region FR therebetween.

Figure 5:
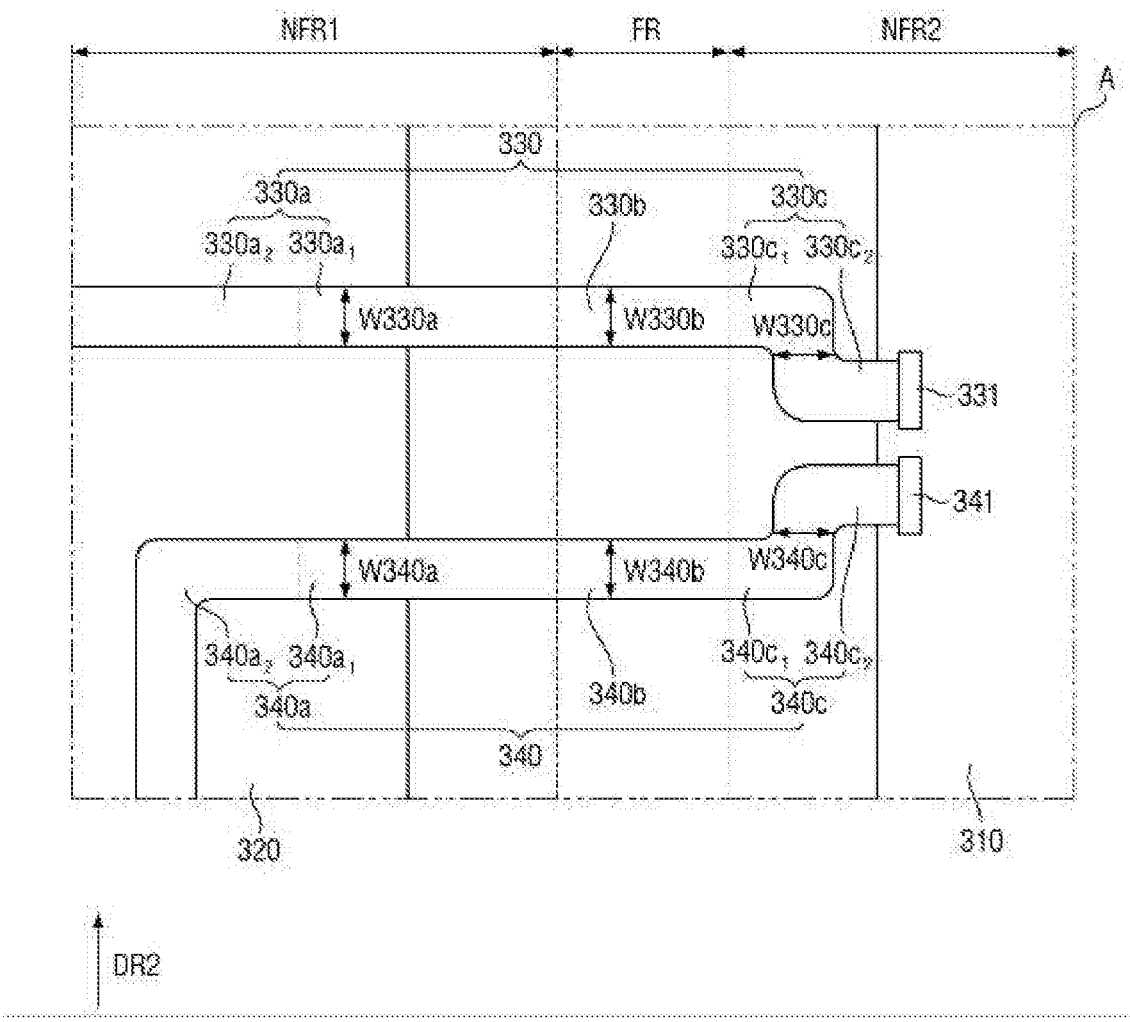
FIG. 5 is an enlarged view of area A shown in FIG. 1.
Figure 6:
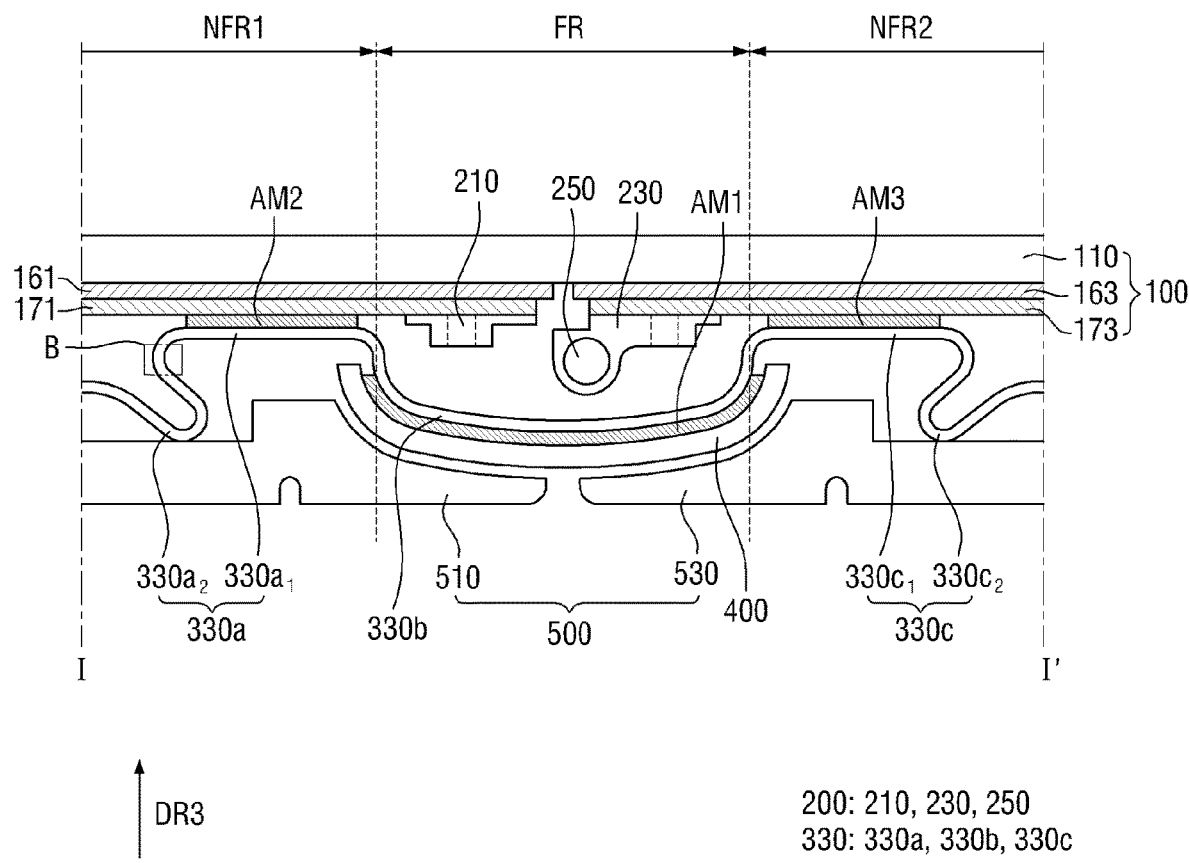
FIG. 6 is a cross-sectional view taken along line I-I' of FIG. 1.
Figure 7:
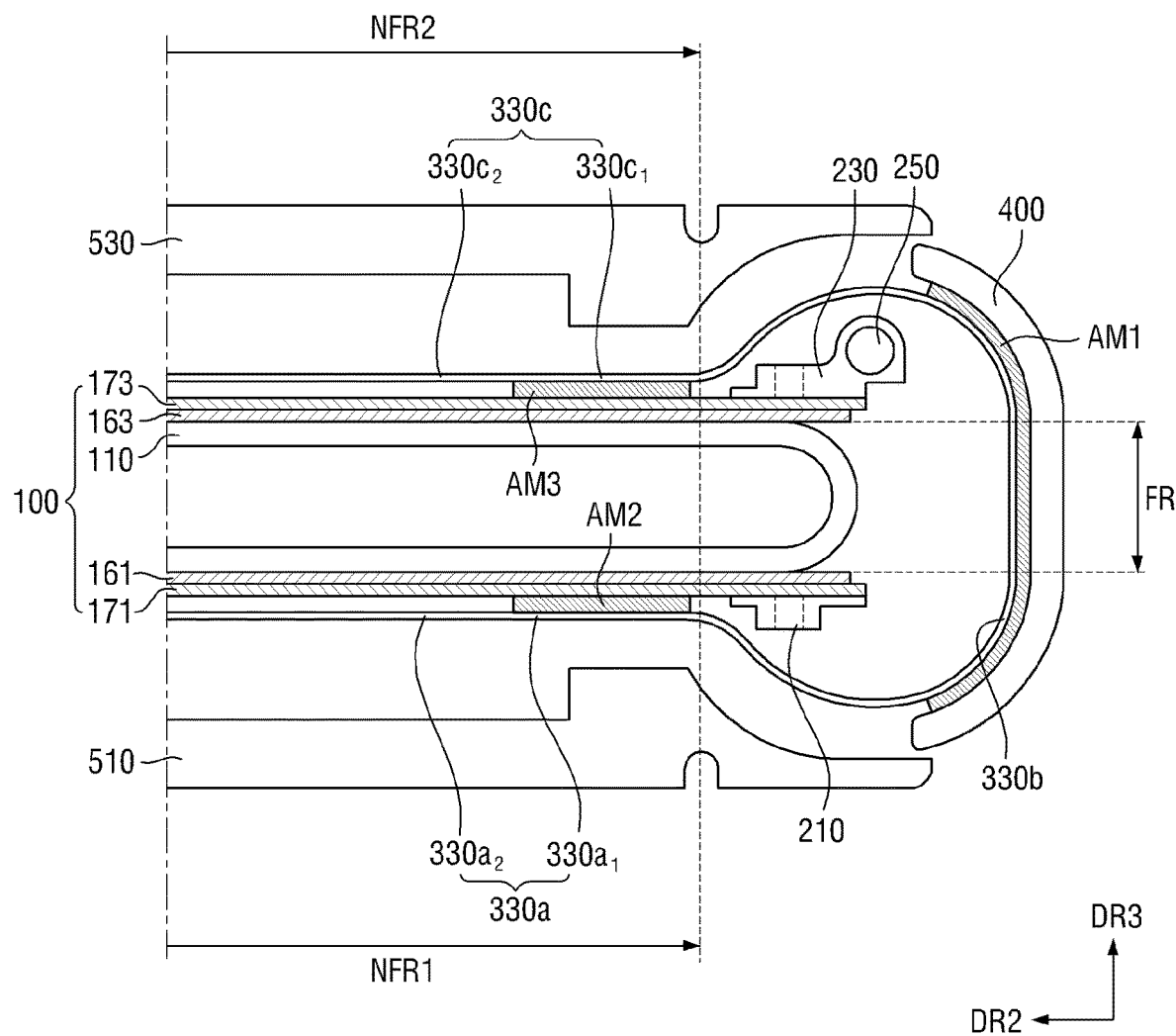
FIG. 7 is a cross-sectional view of a display device according to an exemplary embodiment of the present invention when folded.
Figure 8:
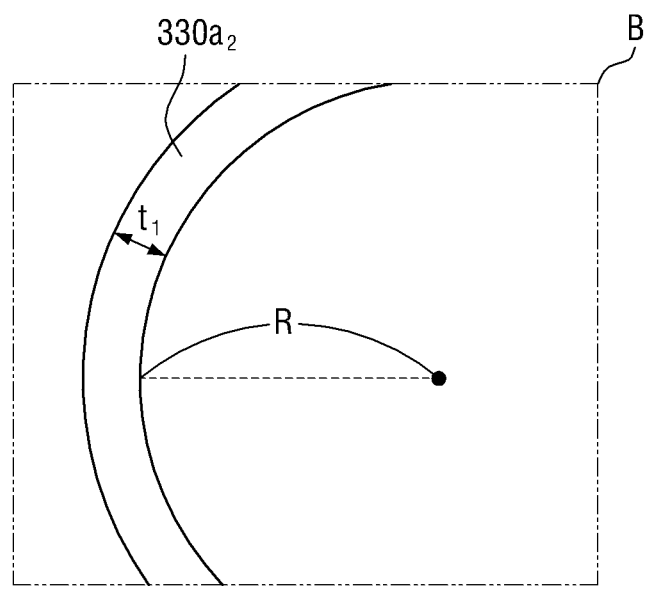
FIG. 8 is an enlarged view of area B of FIG. 6.

FIG. 5 is an enlarged view of area A shown in FIG. 1. FIG. 6 is a cross-sectional view taken along line I-I' of FIG. 1. FIG. 7 is a cross-sectional view of a display device according to an exemplary embodiment of the present invention when it is folded. FIG. 8 is an enlarged view of area B of FIG. 6.

Referring to FIGS. 5 to 8 in conjunction with FIG. 1, a plurality of pixels is disposed in the area of the display panel 110 overlapping with the display area DA, and signal lines or driving circuits for applying a signal to each pixel may be disposed in the area of the display panel 110 overlapping with the non-display area NDA.

Each of the pixels may include an emissive layer and a circuit layer for controlling the amount of light emitted from the emissive layer. The circuit layer may include a plurality of lines, a plurality of electrodes and at least one transistor. According to an exemplary embodiment of the present invention, the emissive layer may include an organic light-emitting material. The emissive layer may be sealed by an encapsulation layer. The encapsulation layer can seal the emissive layer to prevent moisture and the like from being introduced from the outside. The encapsulation layer may be made up of a single inorganic layer or multiple layers thereof, or a stack of inorganic layers and organic layers alternately stacked on one another.

The support members 161 and 163 may be disposed under the display panel 110. The first support member 161 may overlap the entire surface of the first non-folding region NFR1 and a part of the folding region FR, and the second support member 163 may overlap the entire surface of the second non-folding region NFR2 and a part of the folding region FR. The first support member 161 and the second support member 163 may be spaced apart from each other by a predetermined distance on the folding region FR.

The support members 161 and 163 may include a metal or an alloy of at least two metals. Examples of the metals included in the support members 161 and 163 include, but is not limited to, aluminum (Al), copper (Cu), iron (Fe), chromium (Cr), and the like. According to an exemplary embodiment of the present invention, the support members 161 and 163 may include stainless steel (SUS), which is an alloy of iron (Fe) and chromium (Cr).

An adhesive layer may be further disposed between each of the support members 161 and 163 and the display panel 110. The adhesive layer may be disposed across the non-folding regions NFR1 and NFR2 and the folding region FR of the display module 100. The support members 161 and 163 may be coupled with the display panel 110 by the adhesive layer. In the exemplary embodiment where the adhesive layer is disposed across the non-folding regions NFR1 and NFR2 and the folding region FR of the display module 100, the coupling force between the display module 100 and the support members 161 and 163 in the non-folding regions NFR1 and NFR2 may be different from that in the folding region FR. The coupling force between the display module 100 and the support members 161 and 163 on the non-folding regions NFR1 and NFR2 may be greater than the coupling force between the display module 100 and the support members 161 and 163 on the folding region FR. The coupling force between the display module 100 and the support members 161 and 163 on the folding region FR is actually very weak. Accordingly, the display module 100 may be physically separated from the support members 161 and 163 on the folding region FR when the display device 1 is folded. In the above-described exemplary embodiment, the adhesive layer disposed on the folding region FR may be attached to the display module 100 or to the support members 161 and 163 when the display device is folded. In such case, the exposed adhesive layer may be vulnerable to particles, etc.

In order to prevent this, the adhesive layer may not be disposed on the folding region FR. That is to say, the adhesive layer may overlap with the non-folding regions NFR1 and NFR2 but not with the folding region FR. Therefore, when the display device 1 is folded, the display module 100 and the support members 161 and 163 are attached together on the non-folding regions NFR1 and NFR2, but may be physically separated from each other on the folding region FR.

The metal plates 171 and 173 may be disposed under the support members 161 and 163, respectively. The first metal plate 171 may overlap the entire surface of the first non-folding region NFR1 and a part of the folding region FR, and the second metal plate 173 may overlap the entire surface of the second non-folding region NFR2 and a part of the folding region FR. The first metal plate 171 and the second metal plate 173 may be spaced apart from each other by a predetermined distance on the folding region FR.

An adhesive layer may be further disposed between the metal plates 171 and 173 and the support members 161 and 163. The adhesive layer may serve to couple the metal plates 171 and 173 with the support members 161 and 163.

The metal plates 171 and 173 may include a metal or an alloy of at least two metals. Examples of the metals included in the metal plates 171 and 173 include, but is not limited to, aluminum (Al), copper (Cu), iron (Fe), chromium (Cr), and the like. According to an exemplary embodiment of the present invention, the metal plates 171 and 173 may include aluminum (Al).

The hinge assembly 200: 210, 230, and 250 may be disposed under the metal plates 171 and 173. The hinge assembly 200 may include a first hinge portion 210 overlapping with the first metal plate 171, a second hinge portion 230 overlapping with the second metal plate 173, and a hinge column 250 disposed inside the second hinge portion 230. Although not shown in the drawings, the hinge column 250 is fastened to the first hinge portion 210 when the display device is unfolded, and is not fastened to the first hinge portion 210 when the display device is folded to allow the folding.

The fixing member 400 may be disposed under the hinge assembly 200. The fixing member 400 may overlap the hinge assembly 200 and cover the hinge assembly 200 entirely, to prevent particles from entering the hinge assembly 200 that may otherwise cause defects of the hinge assembly 200. The cross-sectional shape of the fixing member 400 has been described above and, therefore, any redundant description will be omitted. The set covers 500: 510 and 530 may be disposed under the fixing member 400.

The first flexible printed circuit board 330 may be disposed between the display module 100 and the set covers 500. Although only the first flexible printed circuit board 330 has been described above with reference to FIGS. 6 and 8, the second flexible printed circuit board 340 is substantially identical to the first flexible printed circuit board 330 except that the overall shape and the elements connected thereto. Accordingly, those skilled in the art will understand that the description of the first flexible printed circuit board 330 can be equally applied to the second flexible printed circuit board 340.

The first flexible printed circuit board 330 may include a flexible material.

The first flexible printed circuit board 330 may include a (1-1) portion 330*b* overlapping the folding region FR, a (1-2) portion 330*a* physically connected with the (1-1) portion 330*b* and overlapping the first non-folding region NFR1, and a (1-3) portion 330*c* physically connected with the (1-1) portion 330*b* and overlapping the second non-folding region NFR2.

The (1-1) portion 330*b* may overlap the fixing member 400 and the hinge assembly 200 in the folding region FR. A first coupling member AM1 may be disposed between the (1-1) portion 330*b* and the fixing member 400. The first coupling member AM1 may be, but is not limited to, a double-sided tape. It may also be an adhesive resin.

The first coupling member AM1 may be disposed more to the inside than the outer side surfaces of the fixing member 400. In this manner, it is possible to avoid that the material of the first coupling member AM1 overflows to the outer side surfaces of the fixing member 400 when the fixing member 400 and the first flexible printed circuit board 330 are coupled by the first coupling member AM1 and the set covers 500 under the fixing member 400 are coupled with the fixing member 400 to thereby interfere the folding operation.

The (1-1) portion 330*b* is coupled with the fixing member 400 even though the display device 1 is folded and unfolded repeatedly, and thus, there is almost no change in the length. Accordingly, it is possible to prevent interference between nearby elements. Furthermore, the first coupling member AM1 attached directly to the (1-1) portion 330*b* can buffer or reduce the bending stress applied to the flexible printed circuit board 330 as the display device is folded and unfolded repeatedly. In addition, as described above, because the (1-1) portion 330*b* is coupled with the fixing member 400, there is no change in the length even though the display device is folded and unfolded repeatedly, so that it is possible to avoid breakage of the first flexible printed circuit board 330.

The (1-1) portion 330*b* of the first flexible printed circuit board 330 attached to the fixing member 400 having the curved cross-sectional shape may have a curved shape that is convex toward the second surface conforming to the cross-sectional shape of the fixing member 400.

In some exemplary embodiments, the (1-1) portion 330*b* may be coupled to the fixing member 400 by a fastening screw or the like.

The (1-2) portion 330*a* and the (1-3) portion 330*c* may be extended to a first side and a second side of the (1-1) portion 330*b*, respectively. The (1-2) portion 330*a* may include a (1-2-1) portion 330*a*1 physically connected to the (1-1) portion 330*b* and attached to the display module 100, and a (1-2-2) portion 330*a*2 spaced apart from the (1-1) portion 330*b* with the (1-2-1) portion 330*a*1 therebetween. The (1-3) portion 330*c* may include a (1-3-1) portion 330*c*1 physically connected to the (1-1) portion 330*b* and attached to the display module 100, and a (1-3-2) portion 330*c*2 spaced apart from the (1-1) portion 330*b* with the (1-3-1) portion 330*c*1 therebetween.

As shown in FIG. 5, the (1-2-1) portion 330*a*1 and the (1-3-1) portion 330*c*1 may not overlap with the folding region FR but may overlap with the non-folding regions NFR1 and NFR2, respectively. A part of the (1-2-1) portion 330*a*1 may overlap with the battery 320. The (1-3-1) portion 330*c*1 may be extended in the first direction DR1 and bent downward in the second direction DR2, and the bent portion (included in the (1-3-1) portion 330*c*1) may be physically connected to the (1-3-2) portion 330c2. The (1-3-2) portion 330c2 contiguous to the bent portion may be extended in the second direction DR2 and bent again in the first direction DR1 to be physically connected to the connector 331.

The width W330b of (1-1) portion 330b (width in the second direction DR2), the width W330a of (1-2) portion 330a (width in the second direction DR2), and the width W330c of the (1-3) portion 330c (the width in the first direction DR1 or the width in the second direction DR2) may be substantially all equal. According to an exemplary embodiment of the present invention, the width W330b of (1-1) portion 330b (width in the second direction DR2), the width W330a of (1-2) portion 330a (width in the second direction DR2), and the width W330c of the (1-3) portion 330c (the width in the first direction DR1 or the width in the second direction DR2) may be all equal.

In addition, the (2-2-1) portion 340a1 and the (2-3-1) portion 340c1 may not overlap with the folding region FR but may overlap with the non-folding regions NFR1 and NFR2, respectively. A part of the (2-2-1) portion 340a1 may overlap with the battery 320. The (2-3-1) portion 340c1 may be extended in the first direction DR1 and bent upward in the second direction DR2, and the bent portion (included in the (2-3-1) portion 340c1) may be physically connected to the (2-3-2) portion 340c2. The (2-3-2) portion 340c2 contiguous to the bent portion may be extended in the second direction DR2 and bent again in the first direction DR1 to be physically connected to the connector 341. The (2-2-1) portion 340a1 may be extended along the first direction DR1. The (2-2-2) portion 340a2 contiguous to the (2-2-1) portion 340a1 may be extended along the first direction DR1 and bend downward in the second direction DR2 to be extended.

The width W340b of (2-1) portion 340b (width in the second direction DR2), the width W340a of (2-2) portion 340a (width in the second direction DR2 or width in the first direction DR1), and the width W340c of the (2-3) portion 340c (the width in the first direction DR1 or the width in the second direction DR2) may be substantially all equal. According to an exemplary embodiment of the present invention, the width W340b of (2-1) portion 340b (width in the second direction DR2), the width W340a of (2-2) portion 340a (width in the second direction DR2 or width in the first direction DR1), and the width W340c of the (2-3) portion 340c (the width in the first direction DR1 or the width in the second direction DR2) may be substantially all equal.

The flexible printed circuit boards 330 and 340 may have generally the same thickness. According to an exemplary embodiment of the present invention, the flexible printed circuit boards 330 and 340 may have a first thickness t1 of approximately 0.09 mm.

Referring back to FIG. 6, the (1-2-1) portion 330a1 may be attached to the first metal plate 171. A second coupling member AM2 may be disposed between the (1-2-1) portion 330a1 and the first metal plate 171. The second coupling member AM2 may be, but is not limited to, a double-sided tape. It may also be an adhesive resin. The (1-3-1) portion 330c1 may be attached to the second metal plate 173. A third coupling member AM3 may be disposed between the (1-3-1) portion 330a1 and the second metal plate 173. The third coupling member AM3 may be, but is not limited to, a double-sided tape. The third coupling member AM3 may also be an adhesive resin.

The (1-1) portion 330b is attached to the fixing member 400 thereunder, and the (1-2-1) portion 330a1 and the (1-3-1) portion 330c1 are attached to the metal plates 171 and 173 thereon, respectively. Accordingly, the portion where the (1-1) portion 330b and the (1-2-1) portion 330a1 are connected (included in the (1-1) portion 330b or the (1-2-1) portion 330a1) and the portion where the (1-1) portion 330b and the (1-3-1) portion 330c1 are connected (included in the (1-1) portion 330b or the (1-3-1) portion 330c1) may have a curved cross-sectional shape that is convex toward the upper side or the folding region FR.

Because the metal plates 171 and 173 are attached on the (1-2-1) portion 330a1 and the (1-3-1) portion 330c1 of the first flexible printed circuit board 330, respectively, they may have a flat cross-sectional shape, unlike the (1-1) portion 330b having the curved cross-sectional shape.

In addition, since the (1-2-1) portion 330a1 and the (1-3-1) portion 330c1 are attached to the metal plates 171 and 173 thereon, even though the folding operation and the unfolding operation are repeated, there is almost no change in the length, so that it is possible to prevent interference between nearby elements in the areas. Furthermore, the second coupling member AM2 attached directly to the (1-2-1) portion 330a1 can buffer or reduce the bending stress in the folding region FR that is applied to the first flexible printed circuit board 330 as the display device is repeatedly folded and unfolded.

The (1-2-2) portion 330a2 may be extended from a side of the (1-2-1) portion 330a1, and the (1-3-2) portion 330c2 may be extended from another side of the (1-3-1) portion 330c1. The (1-2-2) portion 330a2 and the (1-3-2) portion 330c2 may be physically connected to the connectors 332 and 331, respectively. The (1-2-2) portion 330a2 and the (1-3-2) portion 330c2 may not be attached to the metal plates 171 and 173, unlike the (1-2-1) portion 330a1 and the (1-3-1) portion 330c1, and may not be attached to the fixing member 400, unlike the (1-1) portion 330b. When the display module 100 is bent around the folding region FR as the display device 1 according to an exemplary embodiment is folded, the display module 100 has almost no change in the length. However, in order to prevent the flexible printed circuit boards 330 and 340 adjacent to the display module 100 from being broken, their length has to be changed along the direction in which the bent display module 100 is extended. According to the exemplary embodiment of the present disclosure, the (1-2-2) portion 330a2 and the (1-3-2) portion 330c2 are rolled when the display device is unfolded, while they are unrolled along the direction in which the bent display module 100 is extended when the display device is folded. By doing so, it is possible to prevent the flexible printed circuit boards 330 and 340 from being broken even though the display device is folded and unfolded repeatedly. That is to say, the flexible printed circuit boards 330 and 340 have portions that are not attached to nearby elements to thereby have a sufficient length, so that the reliability of the flexible printed circuit boards 330 and 340 can be obtained even though the display device is folded/unfolded repeatedly.

The rolled shape of the (1-2-2) portion 330a2 and the (1-3-2) portion 330c2 will be described. The rolled shape may include at least one curved cross-sectional shape. Firstly, the (1-2-2) portion 330a2 contiguous to the (1-2-1) portion 330a1 and the (1-3-2) portion 330c2 contiguous to the (1-3-2) portion 330c1 may have a first curved shape. Because the (1-2-1) portion 330a1 and the (1-3-1) portion 330c1 are attached to the metal plates 171 and 173 thereon, respectively, the first curved shape may be convex toward the non-folding regions NFR1 and NFR2 from the folding region FR. As described above, the (1-2-2) portion 330a2 and the (1-3-2) portion 330c2 may further include a second curved shape that is more to the inside than the first curved shape (closer to the folding region FR) in order to have portions that are not attached to nearby elements to thereby achieve a sufficient length. The second curved shape may be convex toward the folding region FR from the non-folding regions NFR1 and NFR2. The second curved shape or a portion adjacent to the second curved shape may be in direct contact with the set covers 510 and 530 thereunder.

Incidentally, the (1-2-2) portion 330a2 and the (1-3-2) portion 330c2 have the first curved shape when the display device 1 is unfolded, and have the unrolled shape when the display device 1 is folded. As the display device is folded and unfolded repeatedly, the (1-2-2) portion 330a2 and the (1-3-2) portion 330c2 may also receive the bending stress and may be broken. In particular, if the first curved shape and/or the second curved shape have a shape that is bent too sharply (a shape having a small curvature), it may be more likely that the (1-2-2) portion 330a2 and the (1-3-2) portion 330c2 are broken. Therefore, the first curved shape and/or the second curved shape may have an appropriate curvature.

Referring to FIG. 8, in view of the above, the curvature R of the first curved shape may be about 5 times to 30 times the first thickness t1 of the flexible printed circuit boards 330 and 340. According to an exemplary embodiment of the present third coupling member AM3, the curvature R of the first curved shape may be about 10 times the first thickness t1 of the flexible printed circuit boards 330 and 340.

Referring to FIG. 7, when the display device 1 is folded, the folding region FR may be bent so that the surface of the display module 100 in the first non-folding region NFR1 and the surface of the display module 100 in the second non-folding region NFR2 face each other.

As described above, the coupling force between the display module 100 and the support members 161 and 163 on the folding region FR is actually very weak. Accordingly, the display module 100 may be physically separated from the support members 161 and 163 on the folding region FR when the display device 1 is folded and thus the second surface of the display module 100 may be exposed in the folding region FR.

The hinge column 250 is not fastened to the first hinge portion 210 so that the display device can be folded.

When the display device is folded, the first set cover 510 and the second set cover 530 may be moved so that their lower surfaces face in different directions. For example, first set cover 510 may be moved to face downward while the second set cover 530 may be moved to face upward.

As described above, the (1-1) portion 330b is coupled with the fixing member 400 even though the display device 1 is folded and unfolded repeatedly, and thus there is almost no change in the length. Accordingly, it is possible to prevent interference between nearby elements. Furthermore, the first coupling member AM1 attached directly to the (1-1) portion 330b can buffer or reduce the bending stress applied to the flexible printed circuit board 330 as the display device is folded and unfolded repeatedly. In addition, as described above, because the (1-1) portion 330b is coupled with the fixing member 400, there is no change in the length even though the display device is folded and unfolded repeatedly, so that it is possible to avoid the first flexible printed circuit board 330 from being broken.

In addition, since the (1-2-1) portion 330a1 and the (1-3-1) portion 330c1 are attached to the metal plates 171 and 173 thereon, even though the folding operation and the unfolding operation are repeated, there is almost no change in the length, so that it is possible to prevent interference between nearby elements in the areas. Furthermore, the second coupling member AM2 attached directly to the (1-2-1) portion 330a1 can buffer or reduce the bending stress in the folding region FR that is applied to the first flexible printed circuit board 330 as the display device is folded and unfolded repeatedly.

Moreover, the (1-2-2) portion 330a2 and the (1-3-2) portion 330c2 are rolled when the display device is unfolded, while they are spread out along the direction in which the display module 100 is extended when the display device is folded so that it is possible to prevent the flexible printed circuit boards 330 and 340 from being broken even though the display device is folded and unfolded repeatedly. That is to say, the flexible printed circuit boards 330 and 340 have portions that are not attached to nearby elements to thereby have a sufficient length, so that the reliability of the flexible printed circuit boards 330 and 340 can be obtained even though the display device is repeatedly folded/unfolded.

Hereinafter, other exemplary embodiments of the present disclosure will be described. In the following description, the same or similar elements will be denoted by the same or similar reference numerals, and redundant descriptions will be omitted or briefly described.

Figure 9:
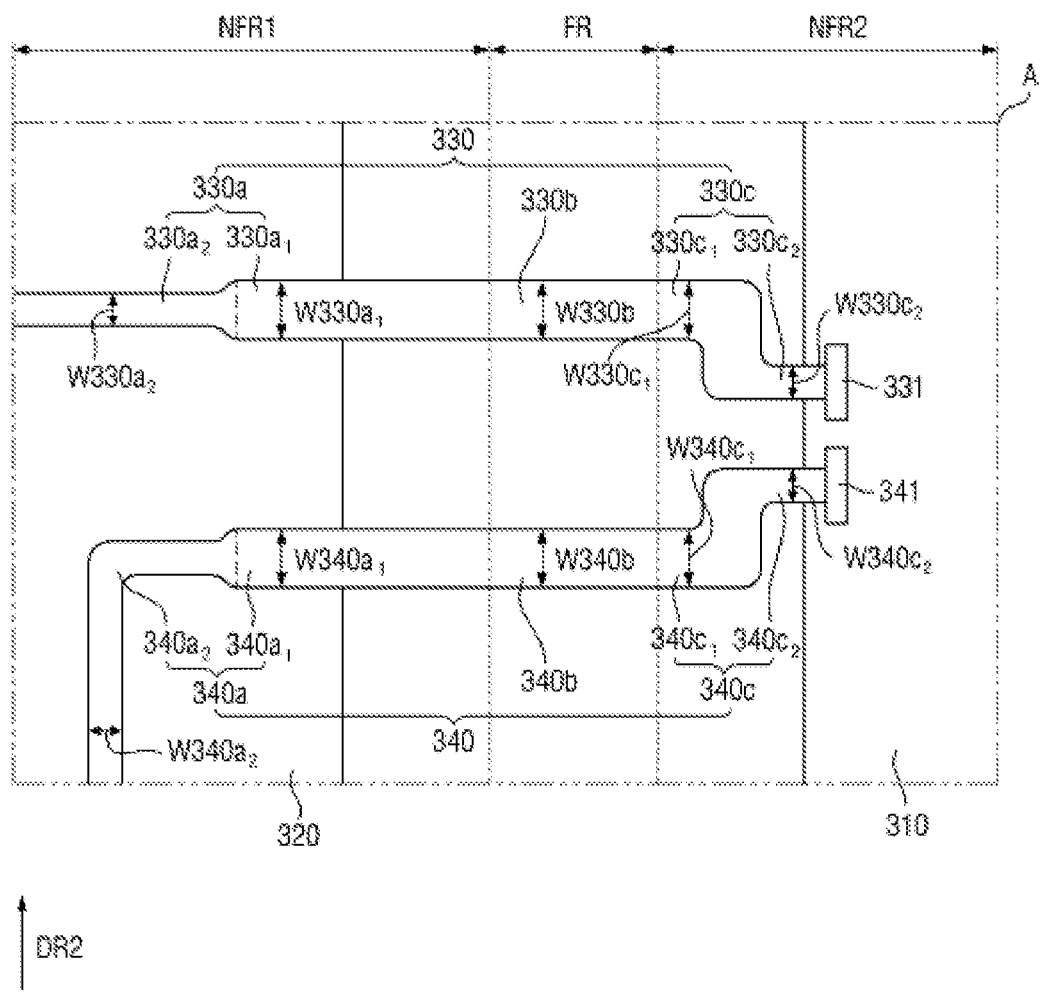
FIG. 9 is a view showing another exemplary embodiment of that shown in FIG. 5.

FIG. 9 is a view showing another exemplary embodiment of that shown in FIG. 5.

A display device according to the exemplary embodiment shown in FIG. 9 differs from the display device according to the exemplary embodiment of FIG. 5 in that the width W330a1 of the (1-2-1) portion 330a1 is different from the width W330a2 of the (1-2-2) portion 330a2; the width W330c1 of the (1-3-1) portion 330c1 is different from the width W330c2 of the (1-3-2) portion 330c2; the width W340a1 of the (2-2-1) portion 340a1 is different from the width W330a2 of the (2-2-2) portion 340a2; and the width W340c1 of the (2-3-1) portion 340c1 is different from the width W340c2 of the (2-3-2) portion 340c2.

More specifically, in the flexible printed circuit boards 330 and 340 according to the exemplary embodiment of the present invention, the width W330a1 of the (1-2-1) portion 330a1 is different from the width W330a2 of the (1-2-2) portion 330a2; the width W330c1 of the (1-3-1) portion 330c1 is different from the width W330c2 of the (1-3-2) portion 330c2; the width W340a1 of the (2-2-1) portion 340a1 is different from the width W330a2 of the (2-2-2) portion 340a2; and the width W340c1 of the (2-3-1) portion 340c1 is different from the width W340c2 of the (2-3-2) portion 340c2.

The width W330a1 of the (1-2-1) portion 330a1 and the width W330c1 of the (1-3-1) portion 330c1 may be equal to the width W330b of the (1-1) portion 330b; and the width W340a1 of the (2-2-1) portion 340a1 and the width W340c1 of the (2-3-1) portion 340c1 may be equal to the width W340b of the (2-1) portion 340b.

The width W330a1 of the (1-2-1) portion 330a1 may be greater than the width W330a2 of the (1-2-2) portion 330a2; the width W330c1 of the (1-3-1) portion 330c1 may be greater than the width W330c2 of the (1-3-2) portion 330c2; the width W340a1 of the (2-2-1) portion 340a1 may be greater than the width W330a2 of the (2-2-2) portion 340a2; and the width W340c1 of the (2-3-1) portion 340c1 may be greater than the width W340c2 of the (2-3-2) portion 340c2.

As described above, the (1-2-2) portion 330a2, the (1-3-2) portion 330c2, the (2-2-2) portion 340a2 and the (2-3-2) portion have the first curved shape when the display device is unfolded, and they may have an unrolled shape when the display device is folded. As the display device is folded and unfolded repeatedly, they may also receive a large bending stress. In this regard, according to the exemplary embodiment, the widths of each of the (1-2-2) portion 330a2, the (1-3-2) portion 330c2, the (2-2-2) portion 340a2 and the (2-3-2) portion 340c2 are smaller than nearby areas, so that it is possible to suppress the portions from being broken due to the bending process.

Figure 10:
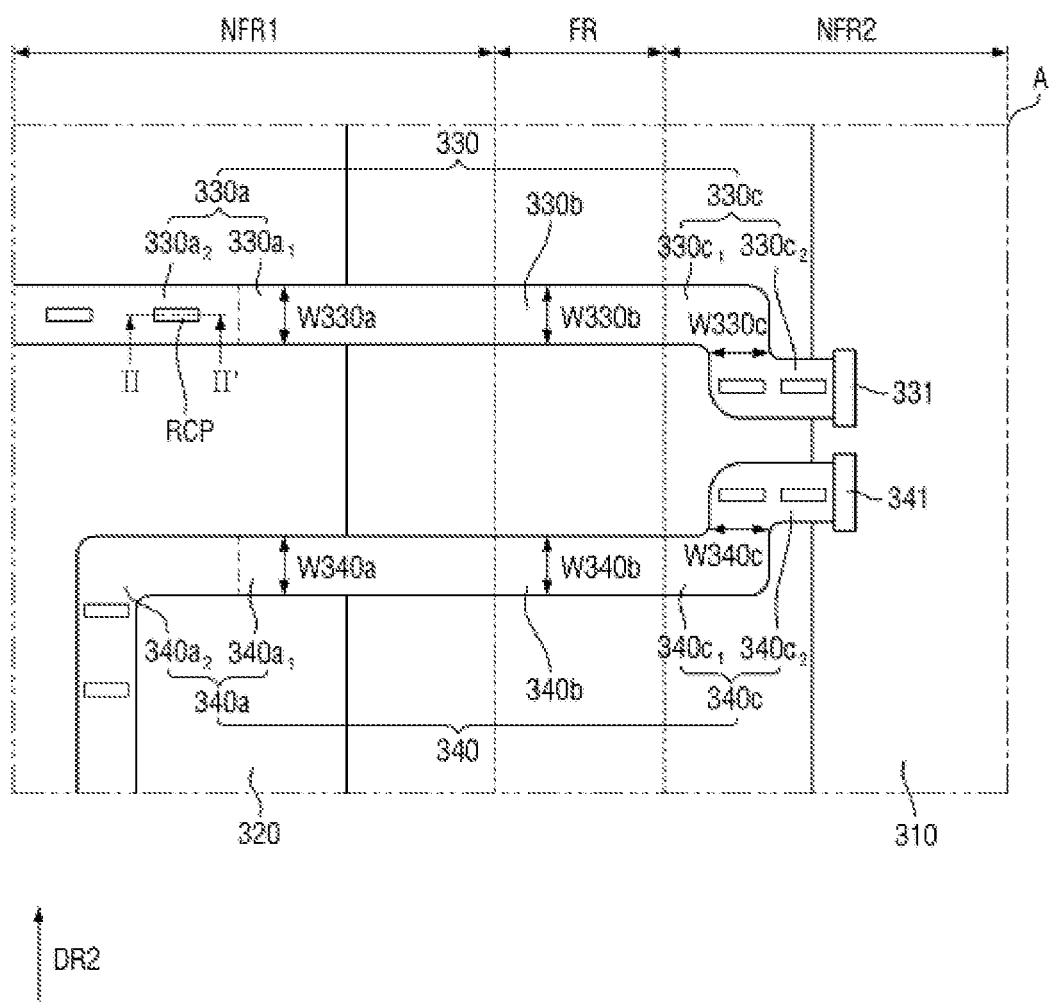
Figure 11:
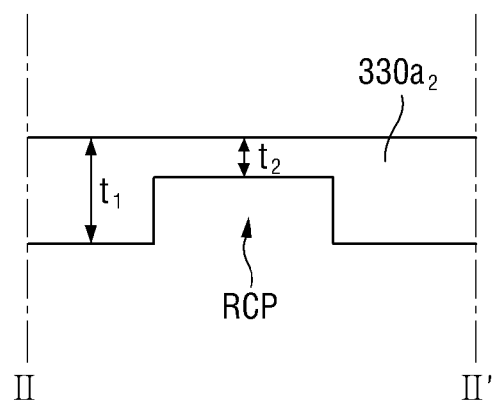
FIG. 11 is a cross-sectional view taken along line II-II' of FIG. 10.

FIG. 10 is a view showing yet another exemplary embodiment of that shown in FIG. 5. FIG. 11 is a cross-sectional view taken along line II-II' of FIG. 10.

A display device according to the exemplary embodiment shown in FIGS. 10 and 11 is different from the exemplary embodiment shown in FIG. 5 in that at least one of a (1-2-2) portion 330a2, a (1-3-2) portion 330c2, a (2-2-2) portion 340a2 and a (2-3-2) portion 340c2 includes recessed grooves RCP extended in the folding direction of the display device (the direction facing the folding region FR from the non-folding regions NFR1 and NFR2.

The recessed grooves RCP may be arranged in a row along the direction in which the (1-2-2) portion 330a2, the (1-3-2) portion 330c2, the (2-2-2) portion 340a2 and the (2-3-2) portion 340c2 are extended. Although the recessed grooves RCP are arranged along the direction in the (1-2-2) portion 330a2, the (1-3-2) portion 330c2, the (2-2-2) portion 340a2 and the (2-3-2) portion 340c2 in the example shown in FIG. 10, this is merely illustrative. The recessed grooves RCP may be arranged in a zigzag pattern.

As shown in FIG. 11, the recessed groove RCP may be formed such that it penetrates a part of the flexible printed circuit boards 330 and 340 from the lower surface (the surface facing the set covers 500) in the thickness direction. It is, however, to be understood that the inventive concepts are not limited thereto. The recessed groove RCP may be formed such that it penetrates a part of the flexible printed circuit boards 330 and 340 from the upper surface. The (1-2-2) portion 330a2, the (1-3-2) portion 330c2, the (2-2-2) portion 340a2 and the (2-3-2) portion 340c2 in which the recessed grooves RCP are formed may have a second thickness t2 less than the first thickness t1.

The recessed grooves RCP may be completely surrounded by the constituent materials of the flexible printed circuit boards 330 and 340 when viewed from the top. It is, however, to be understood that the inventive concepts are not limited thereto. The recessed grooves RCP may be partially surrounded by the constituent materials of the flexible printed circuit boards 330 and 340 when viewed from the top.

According to the exemplary embodiments of the present invention, the flexible printed circuit boards 330 and 340 of the display device further include the recessed grooves RCP extended in the folding direction (the direction facing the folding region FR from the non-folding regions NFR1 and NFR2, so that it is possible to suppress that the (1-2-2) portion 330a2, the (1-3-2) portion 330c2, the (2-2-2) portion 340a2 and the (2-3-2) portion 340c2 are broken by the bending stress.

Figure 12:
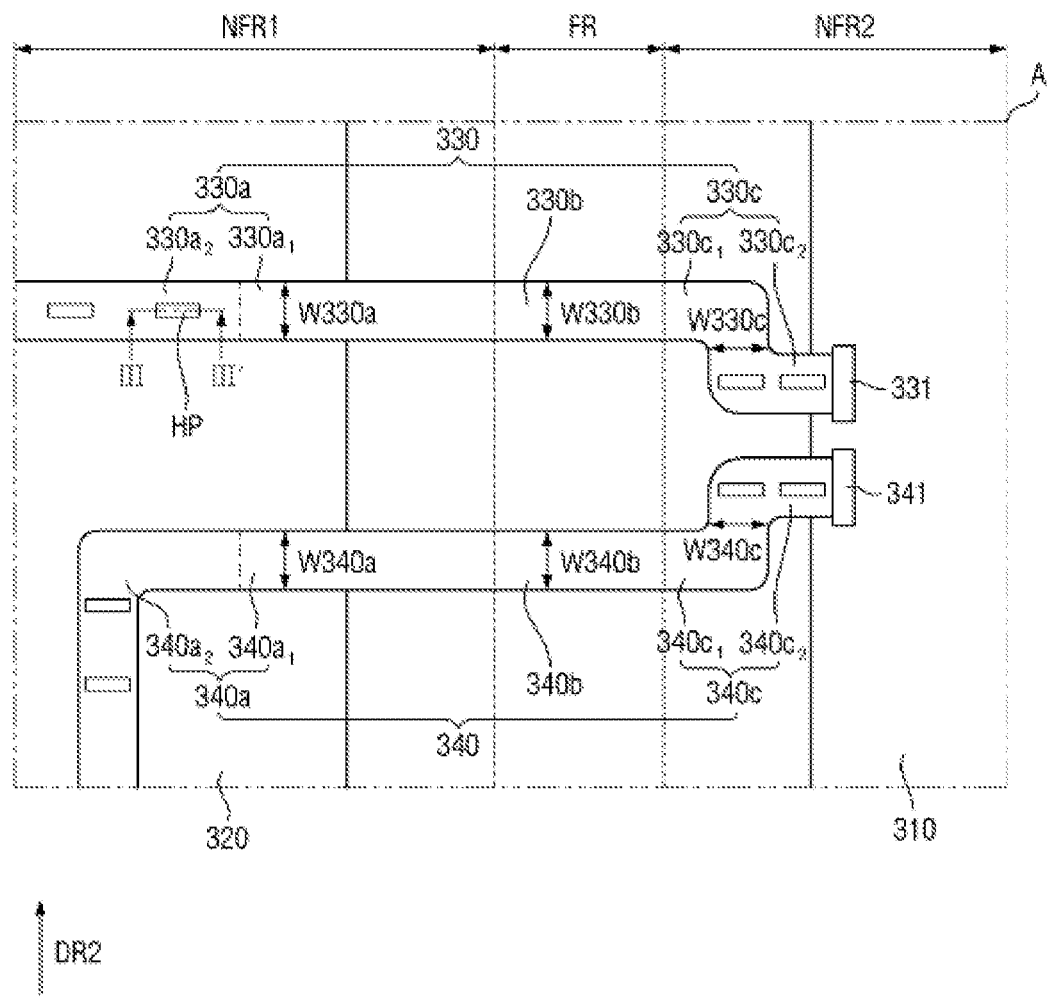
Figure 13:
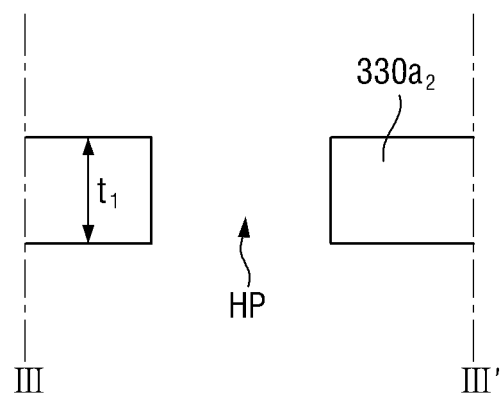
FIG. 13 is a cross-sectional view taken along line III-III' of FIG. 12.

FIG. 12 is a view showing yet another exemplary embodiment of that shown in FIG. 5. FIG. 13 is a cross-sectional view taken along line III-III' of FIG. 12.

A display device according to the exemplary embodiment shown in FIGS. 12 and 13 differs from the display device according to the exemplary embodiment shown in FIG. 5 in that at least one of a (1-2-2) portion 330a2, a (1-3-2) portion 330c2, a (2-2-2) portion 340a2 and a (2-3-2) portion 340c2 includes recessed holes HP extended in the folding direction of the display device (the direction facing the folding region FR from the non-folding regions NFR1 and NFR2.

The recessed holes HP may be completely surrounded by the constituent materials of the flexible printed circuit boards 330 and 340 when viewed from the top. It is, however, to be understood that the inventive concepts are not limited thereto. The recessed grooves RCP may be partially surrounded by the constituent materials of the flexible printed circuit boards 330 and 340 when viewed from the top.

The recessed holes HP according to this exemplary embodiment are substantially identical to the recessed grooves RCP according to the exemplary embodiment of FIGS. 10 and 11, except that the recessed holes HP completely penetrate through the flexible printed circuit is boards 330 and 340 in the thickness direction.

Figure 14:
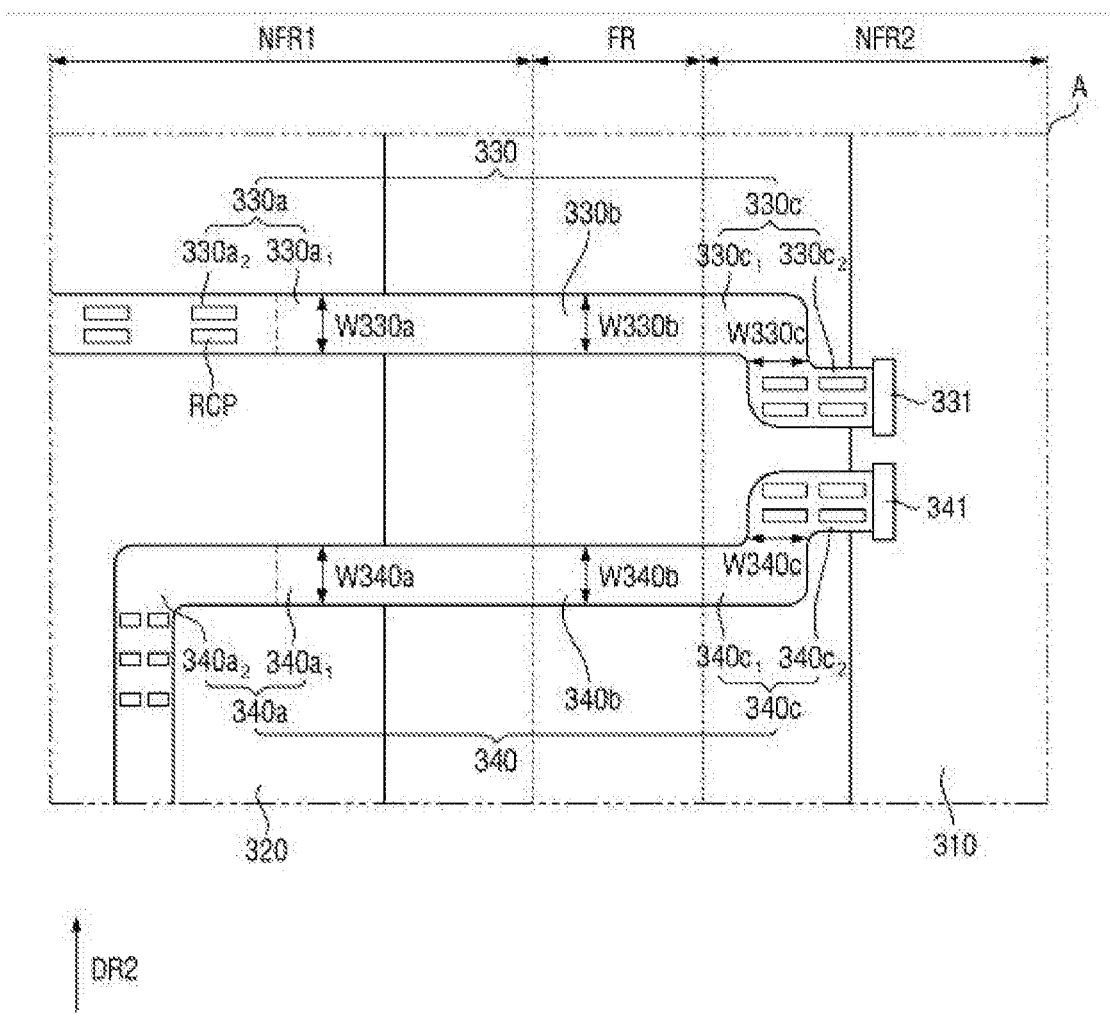

FIG. 14 is a view showing yet another exemplary embodiment of the display device shown in FIG. 5.

A display device according to the exemplary embodiment shown in FIG. 14 differs from the display device according to the exemplary embodiment of FIG. 10 in that the recessed grooves RCP may be arranged in two or more rows along the direction in which a (1-2-2) portion 330a2, a (1-3-2) portion 330c2, and a (2-2-2) portion 340a2 and a (2-3-2) portion 340c2 are extended.

The other elements are identical to those described above with reference to FIG. 10 and, therefore, any redundant description will be omitted.

Figure 15:
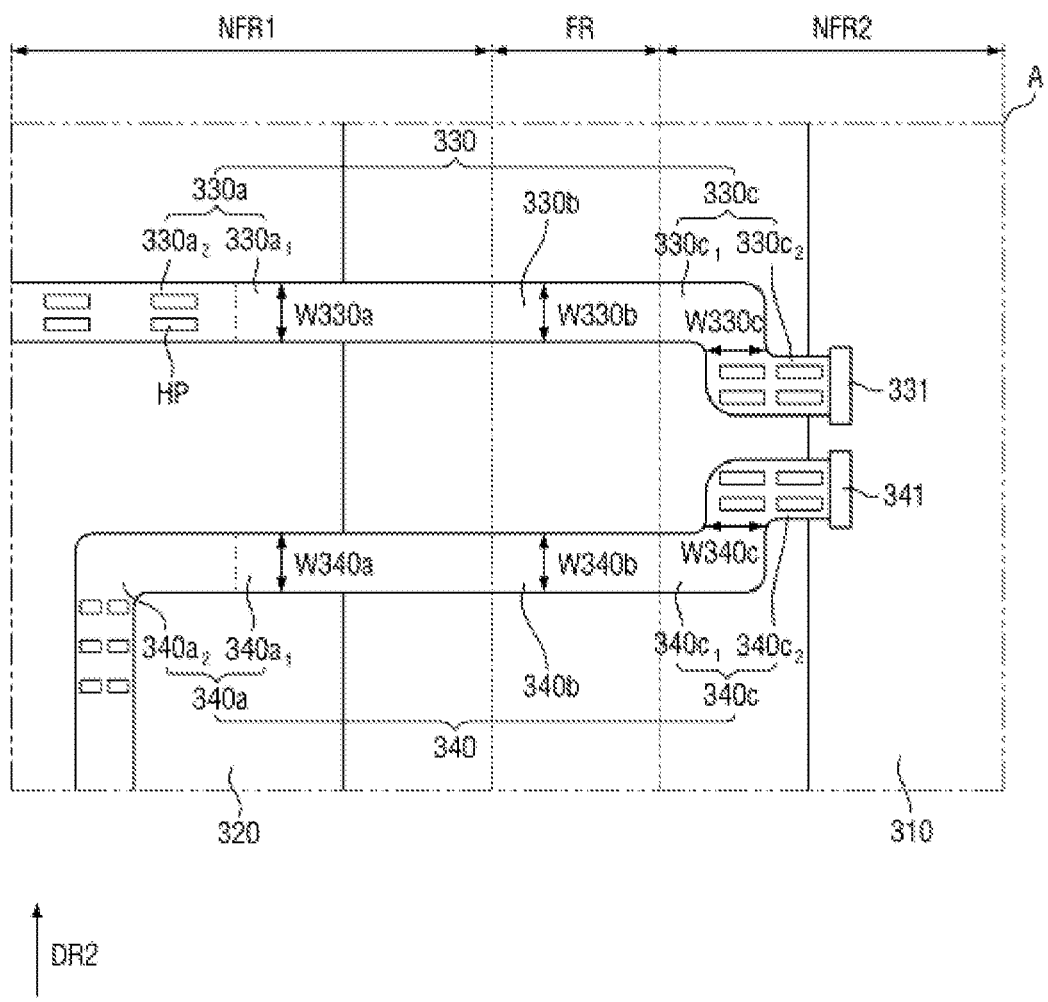

FIG. 15 is a view showing yet another exemplary embodiment of that shown in FIG. 5.

A display device according to the exemplary embodiment shown in FIG. 15 differs from the display device according to the exemplary embodiment of FIG. 12 in that the recessed holes HP may be arranged in two or more rows along the direction in which a (1-2-2) portion 330a2, a (1-3-2) portion 330c2, and a (2-2-2) portion 340a2 and a (2-3-2) portion 340c2 are extended.

The other elements are identical to those described above with reference to FIG. 12 and, therefore, any redundant description will be omitted.

Figure 16:
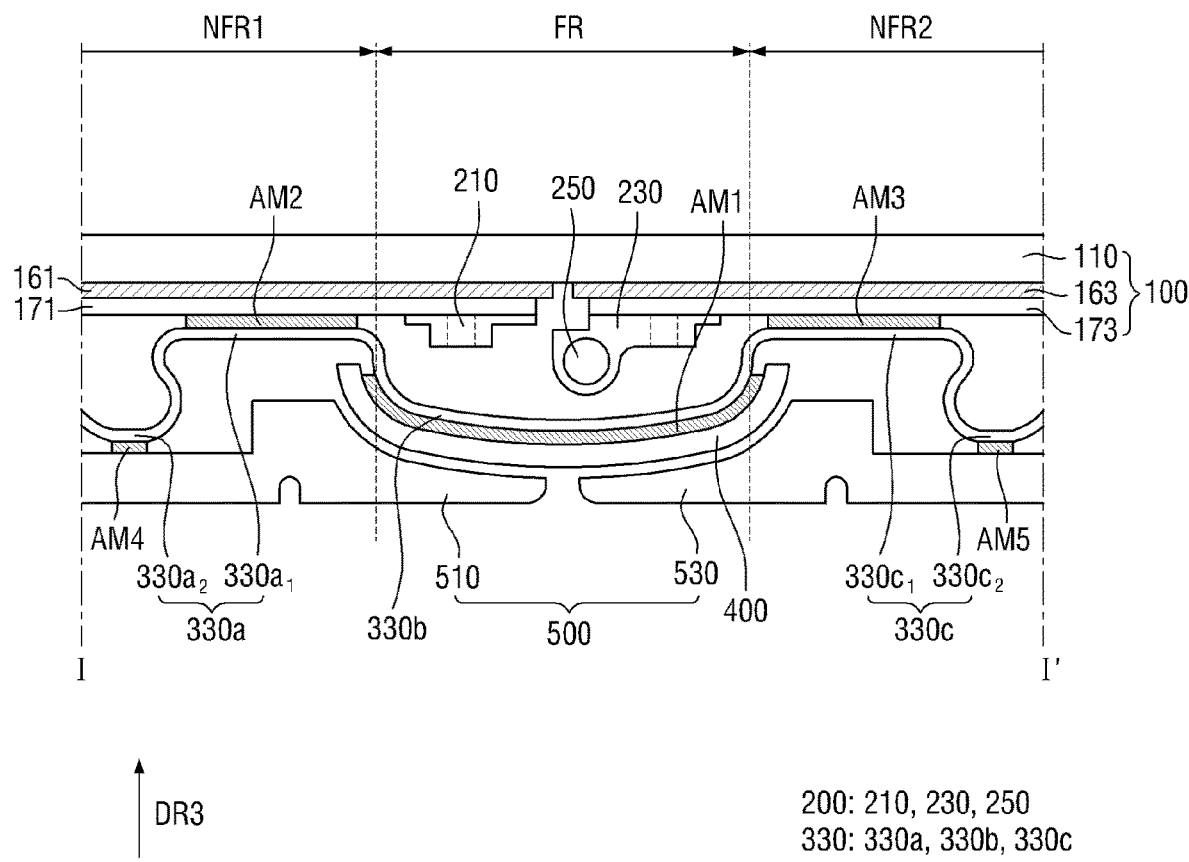
FIG. 16 is a cross-sectional view of a display device according to another exemplary embodiment of the present invention.
Figure 17:
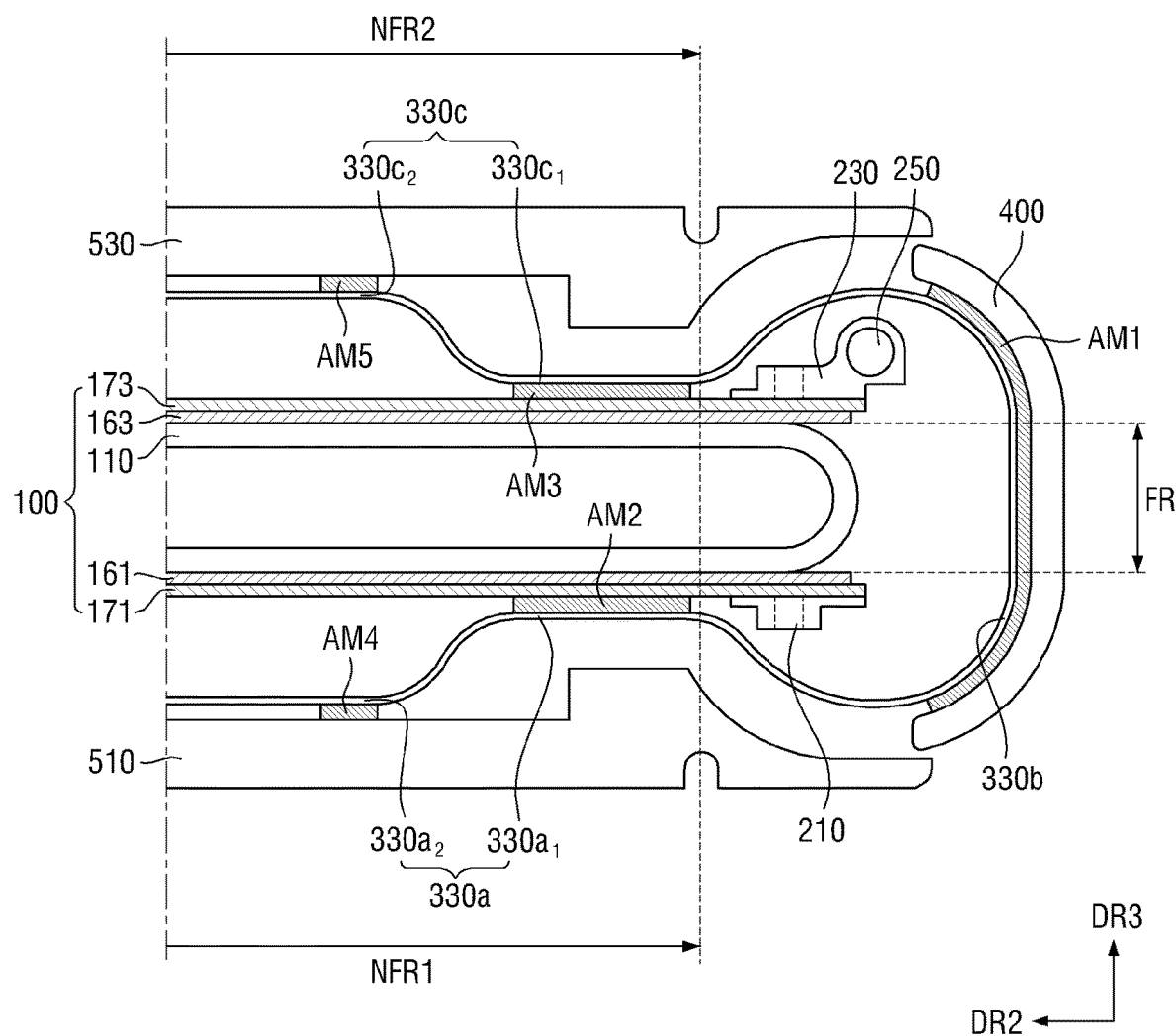
FIG. 17 is a cross-sectional view of a display device according to another exemplary embodiment of the present invention when folded.

FIG. 16 is a cross-sectional view of a display device according to another exemplary embodiment of the present invention. FIG. 17 is a cross-sectional view of a display device according to another exemplary embodiment of the present invention when the display device is folded.

A display device according to the exemplary embodiment shown in FIGS. 16 and 17 is different from the exemplary embodiment of FIGS. 6 and 7 in that a (1-2-2) portion 330a2 and a (1-3-2) portion 330c2 are attached to set covers 510 and 530 by coupling members AM4 and AM5, respectively.

Specifically, as the (1-2-2) portion 330a2 and the (1-3-2) portion 330c2 are attached to set covers 510 and 530 by the coupling members AM4 and AM5, respectively, it is possible to reduce physical interference between the flexible printed circuit boards 330 and 340 and the set covers 510 and 530.

The present invention makes it possible to reduce the possibility of damage to the printed circuit boards and/or interference between nearby elements in a folding region of a display device.

Although certain exemplary embodiments have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
 a display having defined thereon a folding region, a first non-folding region disposed on one side of the folding region, and a second non-folding region disposed on an opposite side of the folding region;

a fixing member disposed under the folding region of the display;
a first flexible printed circuit board disposed between the folding region of the display and the fixing member, the first flexible printed circuit board comprising:
 a (1-1) portion overlapping with the fixing member; and
 a (1-2) portion that is connected to the (1-1) portion and overlaps the first non-folding region;
a first coupling member disposed between the (1-1) portion and the fixing member; and
a second coupling member disposed between the (1-2) portion and the display,
wherein:
the (1-1) portion of the first flexible printed circuit board is attached to the fixing member;
the (1-1) portion is coupled with the fixing member by the first coupling member;
the (1-2) portion comprises:
 a (1-2-1) portion attached to the display by the second coupling member, and
 a (1-2-2) portion spaced apart from the (1-1) portion with the (1-2-1) portion therebetween;
the (1-2-2) portion comprises a plurality of holes penetrating through the (1-2-2) portion from a surface thereof; and
each of the holes is elongated and extends from the first non-folding region toward the folding region when viewed from the top.

2. The display device of claim 1, wherein:
the display comprises a first surface facing a display side and a second surface opposite to the first surface; and
the folding region is bent when the display device is folded so that a surface of the first non-folding region faces a surface of the second non-folding region.

3. The display device of claim 2, wherein the fixing member has a convex cross-sectional shape facing away from the display side.

4. The display device of claim 3, wherein the (1-1) portion of the first flexible printed circuit board has a convex cross-sectional shape facing away from the display side.

5. The display device of claim 4, further comprising a hinge assembly disposed between the (1-1) portion and the folding region of the display,
wherein the folding region of the display is bent over the hinge assembly, and the fixing member covers the hinge assembly.

6. The display device of claim 4, further comprising a battery overlapping the first non-folding region,
wherein;
the (1-2) portion is electrically connected to the battery.

7. The display device of claim 6, wherein the (1-2) portion further comprises a first connector, and the first connector is physically connected to the battery.

8. The display device of claim 6, further comprising a main circuit board overlapping the second non-folding region,
wherein:
the first flexible printed circuit board further comprises a (1-3) portion that is connected to the (1-1) portion and overlaps the second non-folding region; and
the (1-3) portion is electrically connected to the main circuit board.

9. The display device of claim 8, wherein the (1-3) portion further comprises a second connector, and the second connector is physically connected to the main circuit board.

10. The display device of claim 8, wherein the battery and the main circuit board are electrically connected to each other through the first flexible printed circuit board.

11. The display device of claim 8, wherein:
the (1-2-2) portion has a first thickness and comprises at least one curved shape when the display device is unfolded;
a curvature of the curved shape is 5 to 30 times the first thickness; and
the at least one curved shape of the (1-2-1) portion is unrolled when the display device is folded.

12. The display device of claim 8, wherein a width of the (1-2-2) portion is less than a width of the (1-2-1) portion and a width of the (1-1) portion.

13. The display device of claim 12, wherein:
the hole has a first side along a first direction, and a second side along a second direction intersecting the first direction; and
the first direction is a direction that the first non-folding region is toward the folding region.

14. The display device of claim 8, further comprising a third coupling member disposed between the (1-3) portion and the display,
wherein the (1-3) portion comprises a (1-3-1) portion attached to the display by the third coupling member, and a (1-3-2) portion spaced apart from the (1-1) portion with the (1-3-1) portion therebetween.

15. The display device of claim 8, further comprising a second flexible printed circuit board disposed between the folding region of the display and the fixing member,
wherein the second flexible printed circuit board is attached to the fixing member.

16. The display device of claim 15, further comprising an external terminal for receiving an external signal, wherein:
one side of the second flexible printed circuit board overlaps the battery and is electrically connected to the external terminal and another side of the second flexible printed circuit board is electrically connected to the main circuit board; and
the external terminal and the main circuit board are electrically connected to each other through the second flexible printed circuit board.

17. A display device comprising:
a display having defined thereon a folding region, a first non-folding region disposed on one side of the folding region, and a second non-folding region disposed on an opposite side of the folding region;
a fixing member disposed under the folding region of the display; and
a first flexible printed circuit board disposed between the folding region of the display and the fixing member,
wherein:
the first flexible printed circuit board comprises:
 a (1-1) portion overlapping with the fixing member;
 a (1-2) portion connected to the (1-1) portion and overlapping with the first non-folding region; and
 a (1-3) portion overlapping with the second non-folding region;
the (1-1) portion of the first flexible printed circuit board is attached to the fixing member;
the display comprises a first surface facing a display side and a second surface opposite to the first surface;
the folding region is bent when the display device is folded so that a surface of the first non-folding region and a surface of the second non-folding region face each other;

each of the (1-2) portion and the (1-3) portion comprises at least one curved shape when the display device is unfolded;

the curved shape of each of the (1-2) portion and the (1-3) portion is unrolled when the display device is folded;

the (1-2) portion comprises a (1-2-1) portion attached to the display, and a (1-2-2) portion spaced apart from the (1-1) portion with the (1-2-1) portion therebetween;

the (1-2-2) portion comprises a plurality of holes penetrating through the (1-2-2) portion from a surface thereof; and each of the holes is elongated and extends from the first non-folding region toward the folding region when viewed from the top.

18. The display device of claim 17, wherein:

the (1-3) portion comprises a (1-3-1) portion attached to the display and a (1-3-2) portion spaced apart from the (1-1) portion with the (1-3-1) portion therebetween;

each of the (1-2-2) portion and the (1-3-2) portion comprises at least one curved shape when the display device is unfolded; and the curved shape of the (1-2-2) portion and the curved shape of the (1-3-2) portion are unrolled when the display device is folded.

19. The display device of claim 17, wherein:

the hole has a first side along a first direction, and a second side along a second direction intersecting the first direction; and the first direction is a direction that the first non-folding region is toward the folding region.

* * * * *